(12) United States Patent
Lau et al.

(10) Patent No.: US 10,943,532 B2
(45) Date of Patent: Mar. 9, 2021

(54) MONOLITHIC FULL-COLOR LIGHT-EMITTING DIODE DISPLAY PANEL

(71) Applicant: The Hong Kong University of Science and Technology, Hong Kong (CN)

(72) Inventors: Kei May Lau, Hong Kong (CN); Xu Zhang, Hong Kong (CN)

(73) Assignee: The Hong Kong University of Science and Technology

( * ) Notice: Subject to any disclaimer, the term of this patent is extended or adjusted under 35 U.S.C. 154(b) by 95 days.

(21) Appl. No.: 16/408,501

(22) Filed: May 10, 2019

(65) Prior Publication Data

US 2020/0184884 A1 Jun. 11, 2020

Related U.S. Application Data

(60) Provisional application No. 62/917,481, filed on Dec. 11, 2018.

(51) Int. Cl.
*G09G 3/3225* (2016.01)
*G09G 3/20* (2006.01)
(Continued)

(52) U.S. Cl.
CPC ......... *G09G 3/3225* (2013.01); *G09G 3/2003* (2013.01); *H05B 45/10* (2020.01); *H05B 45/20* (2020.01); *G09G 2310/0264* (2013.01)

(58) Field of Classification Search
CPC . G02F 2001/01733; G02F 2001/01741; G02F 2001/0175; G02F 2001/01758; G02F 2001/01766; G02F 2001/01775; G02F 2001/01783; G02F 2001/01791; G02F 1/017; G02F 1/01708; G02F 1/01716; G02F 1/01725; G09G 2310/0264; G09G 3/2003; G09G 3/2014; G09G 3/3216;
(Continued)

(56) References Cited

U.S. PATENT DOCUMENTS 6,069,443 A 5/2000 Jones et al.
6,891,520 B2 5/2005 Chen et al.
(Continued)

OTHER PUBLICATIONS

Qi et al., Dual wavelength InGaN/GaN multi-quantum well LEDs grown by metalorganic vapor phase epitaxy; Journal of crystal growth; vol. 272; pp. 333-340; 2004.
(Continued)

*Primary Examiner* — Kenneth Bukowski
(74) *Attorney, Agent, or Firm* — Spruson & Ferguson (Hong Kong) Limited

(57) ABSTRACT

The present disclosure relates to a monolithic full-color light-emitting diode (LED) display panel. The display panel includes a plurality of pixels and each pixel includes a first LED for emitting light having a first primary color, a second LED for emitting light having a second primary color, a third LED for emitting light having the first primary color, and a color converting layer for converting light generated by the third LED into light having a third primary color. Since the first, second and third LEDs of each pixel are formed with the same multi-layer semiconductor structure, the fabrication process of the display panel can be substantially simplified resulting in higher yield, increased throughput and lower cost.

19 Claims, 24 Drawing Sheets

(51) Int. Cl.
*H05B 45/10* (2020.01)
*H05B 45/20* (2020.01)

(58) Field of Classification Search
CPC ...... G09G 3/3225; H01L 33/00; H05B 45/10; H05B 45/20; Y02B 20/30
See application file for complete search history.

(56) References Cited

U.S. PATENT DOCUMENTS

| | | | |
|---|---|---|---|
| 8,314,429 | B1 | 11/2012 | Raring et al. |
| 8,642,363 | B2 | 2/2014 | Lau et al. |
| 9,548,332 | B2 | 1/2017 | Hu et al. |
| 9,704,833 | B2 | 7/2017 | Kong et al. |
| 9,985,174 | B2 | 5/2018 | El-Ghoroury et al. |
| 2011/0309378 | A1* | 12/2011 | Lau .................. H01L 33/08 257/88 |
| 2014/0160408 | A1* | 6/2014 | Cho .................. G02F 1/133617 349/110 |
| 2016/0359086 | A1 | 12/2016 | El-Ghoroury et al. |
| 2016/0359299 | A1* | 12/2016 | El-Ghoroury .......... H01L 33/32 |
| 2020/0119235 | A1* | 4/2020 | Ahmed ................ H01L 27/322 |

OTHER PUBLICATIONS

Han et al., Resonant-enhanced full-color emission of quantum-dot-based micro LED display technology; Optics Express; vol. 23; pp. 32504-32515; 2015.

Kim et al.; Enhancement of Optical Efficiency in White OLED Display Using the Patterned Photoresist Film Dispersed With Quantum Dot Nanocrystals; Journal of display technology; vol. 12, Issue 6; pp. 526-531; 2016.

Han et al.; Resonant-enhanced full-color emission of quantum-dot-based micro LED display technology; Optics Express; vol. 23, Issue 25; pp. 32504-32515; 2015.

Hikmet et al.; Study of conduction mechanism and electroluminescence in CdSe/ZnS quantum dot composites; Journal of Applied Physics; vol. 93, Issue 6; pp. 3509-3514; 2003.

Liu et al.; Monolithic integration of III-nitride voltage-controlled light emitters with dual-wavelength photodiodes by selective-area epitaxy; Optics Letters; vol. 43, Issue 14; pp. 3401-3404; 2018.

Qi el. al.; Comparison of blue and green InGaN GaN multiple quantum well light emitting diodes grown by metalorganic vapor phase epitaxy; Applied Physics Letters 86, 101903; 2005.

* cited by examiner

MONOLITHIC FULL-COLOR LIGHT-EMITTING DIODE DISPLAY PANEL

CROSS-REFERENCE TO RELATED APPLICATIONS

This application claims the benefit of U.S. Provisional Patent Application No. 62/917,481, filed on Dec. 11, 2018, which is incorporated by reference herein in its entirety.

TECHNICAL FIELD

The present disclosure relates to a monolithic full-color light emitting diode (LED) display panel, fabrication methods thereof, and a system including the monolithic full-color LED display panel.

BACKGROUND

Recently, micro-display technology has been rapidly developed for wearable/portable devices. Although the liquid crystal display (LCD) technology is still widely used, LCDs require a large amount of power for their backlight units and are notorious for their low outdoor visibility. On the other hand, self-emissive organic light emitting diodes (OLED) technology has been used, but OLEDs still have many problems in their lifetime, brightness and efficiency.

Inorganic InGaN/GaN micro-LEDs technology have been rapidly developed for small display applications due to their advantages e.g., high outdoor visibility, high brightness, high efficiency, and long lifetime. Emission of LED-based small displays is substantially monochromic, typically in red, blue, violet or green and a straight forward and manufacturing-friendly path to fabricate full-color micro-displays has not been found. In general, there are two major approaches to address this issue.

The first approach is based on the mass transfer technology, which assembles massive individual micro-LED chips made from separate epitaxial wafers. Nevertheless, a great challenge of this approach is to ensure 100% correct placement of sub-pixels. Moreover, when sub-pixel sizes are small (e.g., <10 μm), this approach is impractical due to low yield, thereby substantially limiting the applications of this technology to smartphones, smart watch displays, and augmented reality, all of which require sub-pixel size much smaller than 10 μm.

The second approach is based on color down-conversion from ultraviolet (UV) to blue, green and red colors by coating CdSe/ZnS quantum dots (QDs) of different sizes on monolithically grown and fabricated UV LED pixels. However, the QDs coating process requires a precise operation of three kinds of QDs on three different sub-pixels. Furthermore, the QD conversion efficiencies are relatively low and tend to degrade quickly in the presence of oxygen or water vapor, particularly at elevated temperature.

On the other hand, a multi-color LED has been increasingly investigated to extend its light emitting color bands through growing blue, green and red InGaN/GaN quantum wells sequentially in one epitaxial process. Single-color dominant emission can be obtained at certain current densities, offering an opportunity to monolithically fabricate full-color LED display without color conversion. Nevertheless, certain InGaN/GaN quantum wells require high indium composition, which introduces a high defect density and a high stress, leading to poor quality and low efficiency of such multi-color LED.

A need therefore exists for an improved full-color display that eliminates or at least diminishes the disadvantages and problems described above.

SUMMARY

Provided herein is a monolithic full-color light-emitting diode (LED) display panel comprising a plurality of pixels, each pixel comprising: a first LED for emitting light having a first primary color; a second LED for emitting light having a second primary color; a third LED for emitting light having the first primary color; and a color converting layer for converting light generated by the third LED into light having a third primary color; wherein: the first LED, the second LED and the third LED are formed with a same multi-layer semiconductor structure such that an individual LED comprises a multiple quantum well (MQW) active region, wherein the MQW active region comprises a first quantum well stack, a second quantum well stack and an intermediate carrier blocking layer sandwiched between the first quantum well stack and the second quantum well stack, the first quantum well stack comprising one or more first quantum wells, the second quantum well stack comprising one or more second quantum wells, each of the first quantum well stack and the second quantum well stack being responsive to charge carriers injected therein for light generation, the first quantum well stack and the second quantum well stack being configured to generate light of mutually different colors, the intermediate carrier blocking layer being configured to modulate a charge-carrier distribution between the first quantum well stack and the second quantum well stack according to a current density of a current applied through the individual LED; and the first quantum well stack, the second quantum well stack and the intermediate carrier blocking layer are co-configured such that first and second ranges of the current density are identified for configuring the individual LED to emit light of the first primary color and light of the second primary color, respectively.

In certain embodiments, the first primary color is blue, the second primary color is green and the third primary color is red.

In certain embodiments, the first quantum well stack comprises an emission peak between 420 nm and 480 nm and the second quantum well stack comprises an emission peak between 510 nm and 580 nm.

In certain embodiments, each first quantum well comprises a first quantum well layer, a first quantum barrier layer and a second quantum barrier layer, and each second quantum well comprises a second quantum well layer, a third quantum barrier layer and fourth quantum barrier layer.

In certain embodiments, the first quantum well layer comprises $In_xGa_{1-x}N$, the second quantum well layer comprises $In_yGa_{1-y}N$, each of the first, second, third and fourth quantum barrier layers comprises GaN.

In certain embodiments, the x of $In_xGa_{1-x}N$ is equal to a value between 0.1 and 0.2 and the y of the $In_yGa_{1-y}N$ is equal to a value between 0.2 and 0.4.

In certain embodiments, the first quantum well layer has a thickness between 1 and 10 nm, the second quantum well layer has a thickness between 1 and 10 nm, each of the first, second, third and fourth quantum barrier layers has a thickness between 5 and 30 nm.

In certain embodiments, the intermediate carrier blocking layer comprises $Al_xGa_{1-x}N$.

In certain embodiments, the x of the $Al_xGa_{1-x}N$ is equal to a value between 0.05 and 0.3.

In certain embodiments, the intermediate carrier blocking layer has a thickness between 10 nm and 100 nm.

In certain embodiments, the first range of the current density is between 0.1 A/cm$^2$ and 10 A/cm$^2$ and the second range of the current density is between 30 A/cm$^2$ and 150 A/cm$^2$.

In certain embodiments, each of the first, second and third LEDs comprises, in overlying sequence, a n-doped semiconductor layer, the MQW active region, an electron blocking layer and a p-doped semiconductor layer.

In certain embodiments, the color converting layer has an emission peak between 610 nm and 700 nm.

In certain embodiments, the color converting layer comprises cadmium selenide/zinc sulfide (CdSe/ZnS) quantum dots or phosphor powder.

In certain embodiments, the intensity of the light having the first primary color, the intensity of the light having the second primary color and the intensity of the light having the third primary color are adjusted and combined in each pixel to provide light having a resultant color.

Provided herein is a full-color display system comprising: the monolithic full-color LED display panel described above; and a data driver and a scan driver are configured to generate a plurality of control signals to drive the first LED of each pixel with a first current density within the first range of the current density, the second LED of each pixel with a second current density within the second range of the current density and the third LED of each pixel with a third current density for emitting light having the first primary color.

Provided herein is a full-color display system using a passive-matrix driving scheme comprising: the monolithic full-color LED display panel described above, wherein the pixels are arranged in an array of m columns and n rows; and a driving circuit comprising a data driver having at least m data lines and a scan driver having at least n scan lines; wherein: the n-doped semiconductor layers of the pixels on the same column are connected together by the data line and coupled to the data driver; the p-doped semiconductor layers of the pixels on the same row are connected together by the scan line and coupled to the scan driver; and the data driver and the scan driver are configured to generate a plurality of control signals to drive the first LED of each pixel with a first current density within the first range of the current density, the second LED of each pixel with a second current density within the second range of the current density and the third LED of each pixel with a third current density for emitting light having the first primary color.

Provided herein is a full-color display system using an active-matrix driving scheme comprising: the monolithic full-color LED display panel described above, wherein the pixels are arranged in an array of m columns and n rows; and an active-matrix driver panel configured to flip-chip bond onto the monolithic full-color LED display panel; wherein: the n-doped semiconductor layers and the p-doped semiconductor layers of the pixels are connected to the active-matrix driver panel; and the active-matrix driver panel is configured to generate a plurality of control signals to drive the first LED of each pixel with a first current density within the first range of the current density, the second LED of each pixel with a second current density within the second range of the current density and the third LED of each pixel with a third current density for emitting light having the first primary color.

Provided herein is a method for fabricating a monolithic full-color LED display panel described above comprising the steps of: providing a buffer layer formed on a substrate; forming a stack of semiconductor layers on the buffer layer and etching portions of the stack of semiconductor layers, thereby forming the first LED, the second LED the third LED with the same multi-layer semiconductor structure for each pixel; and coating the color converting layer on the third LED for each pixel.

In certain embodiments, the method further comprises the step the steps of: performing flip-chip bonding onto an active-matrix driving panel; and removing the substrate to expose the buffer layer as a highest layer such that the color converting layer is coated on the buffer layer.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF DRAWINGS

The appended drawings, where like reference numerals refer to identical or functionally similar elements, contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which.

Skilled artisans will appreciate that elements in the figures are illustrated for simplicity and clarity and have not necessarily been depicted to scale.

DETAILED DESCRIPTION OF THE INVENTION

The term "micro" as used herein may refer to the descriptive size of certain devices in accordance with certain embodiments of the present disclosure. As used herein, the term "micro devices" is meant to refer to the scale of 1 μm to 100 μm. However, it is to be appreciated that embodiments of the present disclosure are not necessarily so limited, and that certain aspects of the embodiments may be applicable to larger, and smaller size scales.

The term "primary color" refers to a visually perceived color of a colored light beam chosen for producing a resultant colored light beam having an intended color. The resultant colored light beam is produced by combining a plurality of (usually three) individual colored light beams having different primary colors in varying amounts, where the varying amounts are determined such that the intended color is obtained in the resultant colored light beam.

It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

The present disclosure relates to a monolithic full-color light-emitting diode display panel and methods to fabricate the same, which overcome the drawbacks of prior art LED display panels and their fabrication methods. The display panel described herein includes a plurality of pixels and each pixel advantageously includes a first LED for emitting light having a first primary color, a second LED for emitting light having a second primary color, a third LED for emitting light having the first primary color, and a color converting layer for converting light generated by the third LED into light having a third primary color. Each of the first, second and third LEDs includes similarly fabricated a multiple quantum well (MQW) active region, which can emit light of different colors according to different current densities of a current applied through it. The intensities of the light of the first primary color, second primary color and third primary color in each pixel can be adjusted and combined to provide light having a resultant color such that a full-color display is provided. Since the first, second and third LEDs of each pixel are formed with a same multi-layer semiconductor structure, the fabrication process of the display panel can be substantially simplified resulting in higher yield, increased throughput and lower cost.

Figure 1:
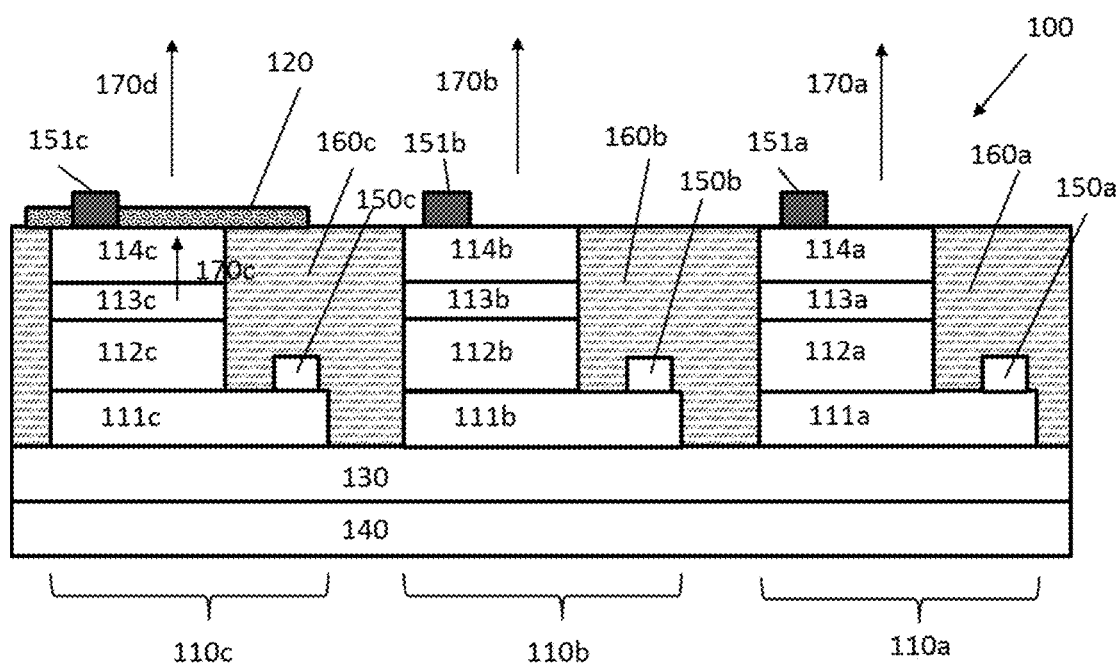
FIG. 1 depicts a cross-sectional view of a pixel of a monolithic full-color LED display panel according to certain embodiments.

FIG. 1 depicts a cross-sectional view of a pixel of a monolithic full-color LED display panel according to certain embodiments. The pixel 100 comprises a first LED 110a, a second LED 110b, a third LED 110c and a color converting layer 120. The first LED 110a is used for emitting light 170a having a first primary color. The second LED 110b is used for emitting light 170b having a second primary color. As a third primary color such as red is difficult to fabricate, the third LED 110c is used for emitting light 170c having the first primary color, and the color converting layer 120 is used for converting the light 170c generated by the third LED 110c into light 170d having a third primary color. The light of the first primary color, the light of the second primary color and the light of the third primary color are combined to provide a resultant color of light for the monolithic full-color light-emitting diode display panel.

The first LED 110a, the second LED 110b and third LED 110c are formed with a same multi-layer semiconductor structure providing a simpler fabrication process as compared to mass transfer technologies and quantum dot coating processes of prior art approaches. In this embodiment, the first LED 110a, the second LED 110b and the third LED 110c are epitaxially grown on a buffer layer 130 by metalorganic chemical vapor deposition or molecular-beam epitaxy. The buffer layer 130 is formed on a substrate 140.

The first LED 110a comprises a first n-doped semiconductor layer 111a, a first MQW active region 112a, a first electron blocking layer 113a and a first p-doped semiconductor layer 114a. The second LED 110b comprises a second n-doped semiconductor layer 111b, a second MQW active region 112b, a second electron blocking layer 113b and a second p-doped semiconductor layer 114b. The third LED 110c comprises a third n-doped semiconductor layer 111c, a third MQW active region 112c, a third electron blocking layer 113c and a third p-doped semiconductor layer 114c.

The first LED 110a is electrically connected to a first n-contact 150a and a first p-contact 151a. In this embodiment, the first n-contact 150a is attached on the first n-doped semiconductor layer 111a and the first p-contact 151a is attached on the first p-doped semiconductor 114a. The second LED 110b is electrically connected to a second n-contact 150b and a second p-contact 151a. In this embodiment, the second n-contact 150a is attached on the second n-doped semiconductor layer 111a and the second p-contact 151a is attached on the second p-doped semiconductor 114a. The third LED 110c is electrically connected to a third n-contact 150c and a third p-contact 151c. In this embodiment, the third n-contact 150c is attached on the third n-doped semiconductor layer 111c and the third p-contact 151c is attached on the third p-doped semiconductor 114c.

The first LED 110a, the second LED 110b and the third LED 110c are electrically isolated from each other. In this embodiment, a first passivation layer 160a is formed between another LED in another pixel (not shown in FIG. 1) and the first LED 110a and covers the first n-contact 150a. A second passivation layer 160b is formed between the first LED 110a and the second LED 110b and covers the second n-contact 150b. A third passivation layer 160c is formed between the second LED 110b and the third LED 110c and covers the third n-contact 150c.

The color converting layer 120 is disposed on the third LED 110c. In this embodiment, the color converting layer 120 is formed on the third p-doped semiconductor layer 114c of the third LED 110c.

Figure 2:
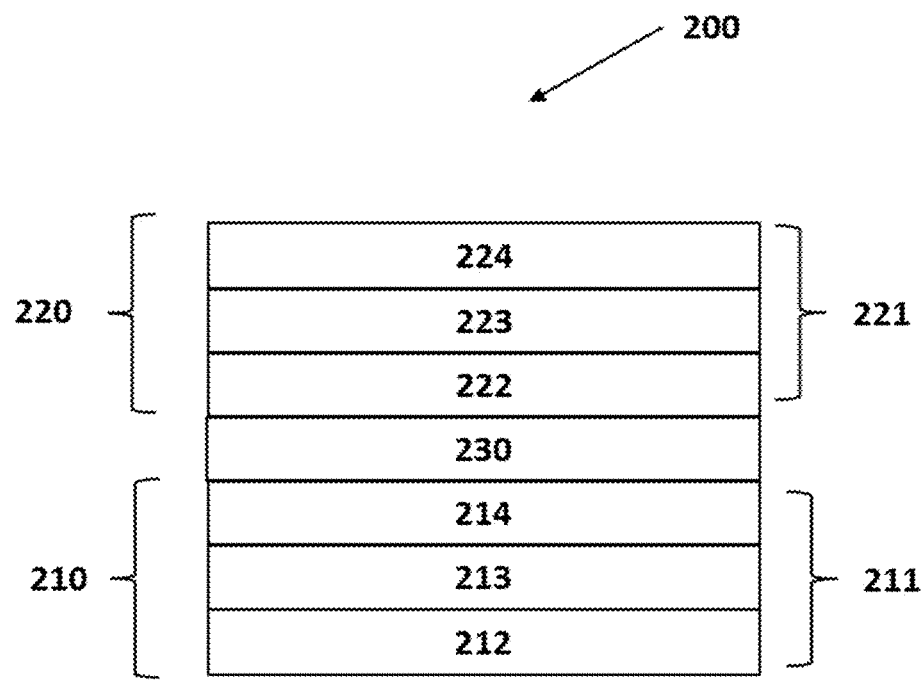
FIG. 2 depicts a cross-sectional view of a MQW active region of a LED according to certain embodiments.

FIG. 2 depicts a cross-sectional view of a MQW active region of a LED according to certain embodiments. The MQW active region 200 comprises a first quantum well stack 210, a second quantum well stack 220 and an intermediate carrier blocking layer 230. The intermediate carrier blocking layer 230 is sandwiched between the first quantum well stack 210 and the second quantum well stack 220. The first, quantum well stack 210 includes a first quantum well 211. The first quantum well 211 includes a quantum barrier layer 212, a first quantum well layer 213, and a quantum barrier layer 214. The first quantum well layer 213 is sandwiched between the quantum barrier layer 212 and the quantum barrier layer 214. The second quantum well stack 220 includes a second quantum well 221. The second quantum well 221 includes a quantum barrier layer 222, a second quantum well layer 223, and a quantum barrier layer 224. The second quantum well layer 223 is sandwiched between the quantum barrier layer 222 and the quantum barrier layer 224. The first quantum well stack 210 and the second quantum well stack 220 are responsive to charge carriers injected therein for light generation and generate light of mutually different colors. In this embodiment, the first quantum well stack 210 emits light of a first primary color and the second quantum well stack 220 emits light of a second primary color. The intermediate carrier blocking layer 230 modulates a charge-carrier distribution between the first quantum well stack 210 and second quantum well stack 220 according to a current density of a current applied through the LED. The first quantum well stack 210, the second quantum well stack 220 and the intermediate carrier blocking layer 230 are co-configured such that first and second ranges of the current density are identified for configuring the LED to emit light of the first primary color and light of the second primary color, respectively.

Figure 3:
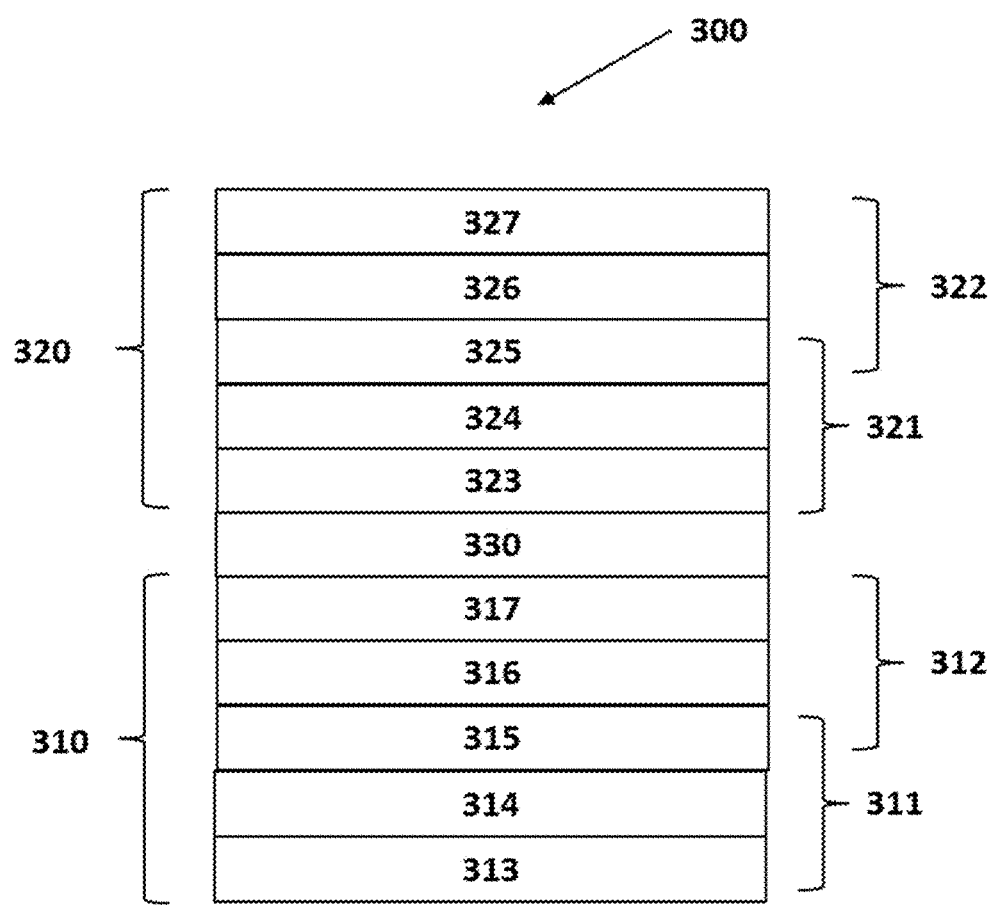
FIG. 3 depicts a cross-sectional view of a MQW active region of another LED according to certain embodiments.

FIG. 3 depicts a cross-sectional view of a MQW active region of another LED according to certain embodiments. The MQW active region 300 comprises a first quantum well stack 310, a second quantum well stack 320 and an intermediate carrier blocking layer 330. The intermediate carrier blocking layer 330 is sandwiched between the first quantum well stack 310 and the second quantum well stack 320. The first quantum well stack 310 includes two first quantum wells 311, 312. The first quantum well 311 includes a quantum barrier layer 313, a first quantum well layer 314, and a quantum barrier layer 315. The first quantum well 312 includes the quantum barrier layer 315, a first quantum well layer 316, and a quantum barrier layer 317. Each of the first quantum wells 311, 312 can be formed with substantially similar materials and structures. The second quantum well stack 320 includes two second quantum wells 321, 322. The second quantum well 321 includes a quantum barrier layer 323, a first quantum well layer 324, and a quantum barrier layer 325. The second quantum well 322 includes the quantum barrier layer 325, a second quantum well layer 326, and a quantum barrier layer 327. Each of the second quantum wells 321, 322 can be formed with substantially similar materials and structures. In this embodiment, the first quantum well stack 310 comprises, in overlying sequence, the quantum barrier layer 313, the first quantum well layer 314, the quantum barrier layer 315, the first quantum well layer 316 and the quantum barrier layer 317. The second quantum well stack 320 comprises, in overlying sequence, the quantum barrier layer 323, the second quantum well layer 324, the quantum barrier layer 325, the second quantum well layer 326 and the quantum barrier layer 327. The first quantum well stack 310 and the second quantum well stack 320 are responsive to charge carriers injected therein for light generation and generate light of mutually different colors. In this embodiment, the first quantum well stack 310 emits light of a first primary color and the second quantum well stack 320 emits light of a second primary color. The intermediate carrier blocking layer 330 modulates a charge-carrier distribution between the first quantum well stack 310 and the second quantum well stack 320 according to a current density of a current applied through the LED. The first quantum well stack 310, the second quantum well stack 320 and the intermediate carrier blocking layer 330 are co-configured such that first and second ranges of the current density are identified for configuring the LED to emit light of the first primary color and light of the second primary color, respectively.

In order to control the brightness of each color for color mixing, time utilizing methods can be applied, e.g., pulse width modulation (PWM) or pulse frequency modulation (PFM).

In certain embodiments, the first primary color is blue, the second primary color is green and the third primary color is red.

In certain embodiments, the light of the first primary color has an emission peak between 420 nm and 480 nm, the light of the second primary color has an emission peak between 510 and 580 nm and the light of the third primary color has an emission peak between 610 nm and 700 nm.

In certain embodiments, the first primary color is cyan, the second primary color is magenta and the third primary color is yellow.

In certain embodiments, the light of the first primary color has an emission peak between 490 nm and 520, the light of the second primary color has an emission peak between 500 and 530 nm and the light of the third primary color has an emission peak between 565 nm and 590 nm.

In certain embodiments, a wavelength of the emission peak of the light of the first color is shorter than that of the second color, and a wavelength of the emission peak of the light of the second color is shorter than that of the third color.

In certain embodiments, each pixel has a pixel size between 1 μm and 300 μm.

In certain embodiments, an active area of the first LED is between 1 μm×1 μm and 300 μm×300 μm, an active area of the second LED is between 1 μm×1 μm and 300 μm×300 μm and an active area of the third LED is between 1 μm×1 μm and 300 μm×300 μm.

In certain embodiments, the active areas of the first LED, the second LED and the third LED are different.

In certain embodiments, the substrate comprises silicon, sapphire, silicon carbide or GaN. In certain embodiments, the substrate has a thickness between 100 μm and 10 mm.

In certain embodiments, the buffer layer comprises GaN, $Al_xGaN$, or AlN. In certain embodiments, the buffer layer has a thickness between 100 nm and 10 μm.

In certain embodiments, when the substrate comprises sapphire, the buffer layer comprises a layer of low-temperature (e.g., 500~700° C.) u-GaN (undoped-GaN) and a layer of high-temperature (e.g., 1000~1300° C.) u-GaN. In certain embodiments, when the substrate comprises silicon, the buffer layer starts from a AlN nucleation layer followed by a graded $Al_xGaN$ layer and end up with an u-GaN layer.

In certain embodiments, the buffer layer is transparent.

In certain embodiments, the n-doped semiconductor layer comprises n-doped GaN. In certain embodiments, the n-doped semiconductor layer has a thickness between 0.1 μm and 10 μm.

In certain embodiments, the n-doped semiconductor layer is a n-doped GaN layer. The n-doped GaN layer can be a Si-doped GaN layer having a donor density between $1×10^{17}$ $cm^{-3}$ and $1×10^{20}$ $cm^{-3}$. The thickness of the Si-doped GaN layer can be between 0.1 μm and 10 μm.

In certain embodiments, the first quantum well stack has an emission peak between 420 nm and 480 nm and the second quantum well stack has an emission peak between 510 nm and 580 nm.

In certain embodiments, the first quantum well stack has an emission peak between 490 nm and 520, the second quantum well stack has an emission peak between 500 and 530 nm.

In certain embodiments, a wavelength of the emission peak of the first quantum well stack is shorter than that of the second quantum well stack.

In certain embodiments, the first quantum well stack comprises one to ten first quantum wells and the second quantum well stack comprises one to ten second quantum wells.

In certain embodiments, each first quantum well comprises a first quantum well layer, a first quantum barrier layer and a second quantum barrier layer, and each second quantum well comprises a second quantum well layer, a third quantum barrier layer and fourth quantum barrier layer. In certain embodiments, the first quantum well layer comprises $In_xGa_{1-x}N$, the second quantum well layer comprises $In_yGa_{1-y}N$, each of the first, second, third and fourth quantum barrier layers comprises GaN. In certain embodiments, the x of $In_xGa_{1-x}N$ is equal to a value between 0.1 and 0.2, 0.12 and 0.18 or 0.14 and 0.16, and the y of the $In_yGa_{1-y}N$ is equal to a value between 0.2 and 0.4, 0.22 and 0.38 or 0.24 and 0.36.

In certain embodiments, the first quantum well layer has a thickness between 1 nm and 10 nm, 3 nm and 8 nm or 5 nm and 6 nm, the second quantum well layer has a thickness between 1 nm and 10 nm, 3 nm and 8 nm or 5 nm and 6 nm, each of the first, second, third and fourth quantum barrier layers has a thickness between 5 nm and 30 nm, 10 nm and 25 nm or 15 nm and 20 nm.

In certain embodiments, the intermediate carrier blocking layer comprises $Al_xGa_{1-x}N$. The x of the $Al_xGa_{1-x}N$ is equal to a value between 0.05 and 0.3, 0.1 and 0.25 or 0.15 and 0.2.

In certain embodiments, the intermediate carrier blocking layer has a thickness between 1 nm and 100 nm, 30 nm and 80 nm or 50 nm and 60 nm.

In certain embodiments, the first range of the current density for emitting light of a first primary color is between 0.1 $A/cm^2$ and 10 $A/cm^2$, 1 $A/cm^2$ and 8 $A/cm^2$, or 3 $A/cm^2$ and 6 $A/cm^2$ and the second range of the current density for emitting light of a second primary color is between 30 $A/cm^2$ and 150 $A/cm^2$, 50 $A/cm^2$ and 130 $A/cm^2$ or 70 $A/cm^2$ and 110 $A/cm^2$.

In certain embodiments, the electron blocking layer comprises p-type $Al_xGaN$ or p-type $In_yGaN/Al_xGaN$, and the x can be between 0.01 and 0.3 and the y can be between 0.01 and 0.3. In certain embodiments, the electron blocking layer has a thickness between 1 nm to 100 nm.

In certain embodiments, the electron blocking layer comprises p-type $Al_{0.05}GaN$. In certain embodiments, the electron blocking layer comprises 2-8 periods of p-type $In_{0.05}GaN$ (e.g., 1-10 nm)/$Al_{0.05}GaN$ (e.g., 1-10 nm).

In certain embodiments, the p-doped semiconductor layer comprises p-doped GaN. In certain embodiments, the p-doped semiconductor layer has a thickness between 50 nm and 500 nm.

In certain embodiments, the p-doped semiconductor layer is a p-doped GaN layer. The p-doped GaN layer can be a Mg-doped GaN layer having an acceptor density between $1\times10^{17}$ cm$^{-3}$ and $1\times10^{20}$ cm$^{-3}$. The thickness of the Mg-doped GaN layer can be between 50 and 500 nm.

In certain embodiments, the p-contact comprises aluminum, nickel, gold, titanium, indium tin oxide or a combination thereof. In certain embodiments, the p-contact has a thickness between 10 nm and 2000 nm.

In certain embodiments, the p-contact comprises two layers including a first layer to contact p-GaN being annealed ITO (indium tin oxide, ~100 nm) or Ni/Au (5/5 nm) and a second layer being Ti/Al-based metal stacks as electrodes or other metal connection.

In certain embodiments, the n-contact comprises titanium, aluminum, gold, chrome, or a combination thereof. In certain embodiments, the n-contact has a thickness between 10 and 2000 nm.

In certain embodiments, the n-contact comprises a metal stack. The metal stack can be a Ti/Al-based metal stack. The Ti/Al-based metal stack can have layers of Ti (e.g., 10-300 nm)/Al (e.g., 10-300 nm)/Ti (e.g., 10-300 nm)/Au (e.g., 10-300 nm).

In certain embodiments, the passivation layer comprises a hard-baked photo-sensitive organic material (e.g., benzocyclobutene-based polymers (BCB), epoxy-based negative photoresist (SU8) or polyimide) or an inorganic material (e.g., $SiO_2$, $Si_3N_4$, $Al_2O_3$, $ZrO_2$ or $NiF_2$).

In certain embodiments, the color converting layer has an emission peak between 610 nm and 700 nm.

In certain embodiments, the color converting layer, which converts light of blue to light of red, comprises an optically-pumped luminescent material, including but not limited to CdSe/ZnS quantum dots (e.g., 1 nm-100 nm), or nano-scale phosphor powder (e.g., 1 nm-100 nm).

In certain embodiments, the color converting layer, which converts light of green to light of red, comprises an optically-pumped luminescent material, including but not limited to CdSe/ZnS quantum dots (e.g., 1 nm-100 nm), or nano-scale phosphor powder (e.g., 1 nm-100 nm).

In certain embodiments, the color converting layer has a thickness between 10 nm and 10 μm, 100 nm and 5 μm or 1 μm and 3 μm.

In certain embodiments, each pixel further comprises a first color filter for filtering light of a non-first primary color generated by the first LED, a second color filter for filtering light of a non-second primary color generated by the second LED, and a third color filter for filtering light of a non-third primary color generated by the color converting layer to improve the monochromaticity of the light generated thereby.

Example 1

Figure 4A:
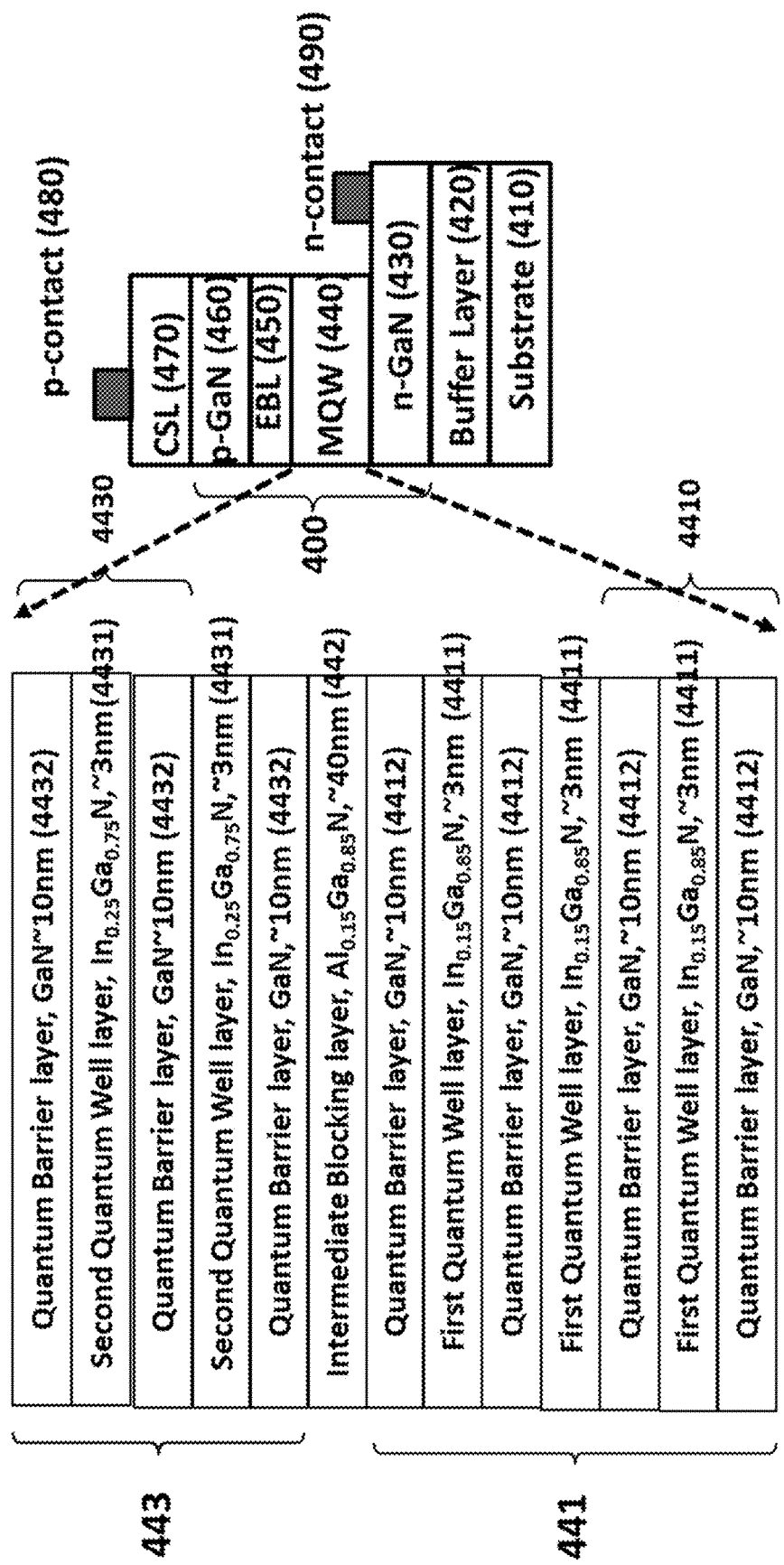
FIG. 4A depicts a cross-sectional view of a LED according to Example 1.

A LED was fabricated and tested for its electroluminescence in Example 1. FIG. 4A depicts a cross-sectional view of a LED according to Example 1. A buffer layer 420 was formed on a substrate 410, and the LED 400 was formed on the buffer layer 420. The LED 400 comprises, in overlying sequence, a n-GaN layer 430, a MQW active region 440, an electron blocking layer (EBL) 450 and a p-GaN layer 460. The substrate 410 comprises sapphire and the buffer layer 420 comprises u-GaN. The n-GaN layer 430 is a Si-doped GaN layer having a thickness of 2-3 nm and an acceptor density of about $1\times10^{18}$ cm$^{-3}$. The electron blocking layer 450 comprises 5 periods of p-type $In_{0.05}GaN$ (2 nm)/$Al_{0.05}GaN$ (2 nm). The p-GaN layer 460 is a Mg-doped GaN layer having a thickness of about 200 nm and a donor density of about $2\times10^{17}$ cm$^3$. The MQW active region 440 comprises a first quantum well stack 441 having three first quantum wells 4410, an intermediate blocking layer 442 and a second quantum well stack 443 having two second quantum wells 4430. The intermediate blocking layer 442 comprises $Al_{0.15}Ga_{0.85}N$ and has a thickness of about 40 nm. Each first quantum well 4410 comprises a first quantum well layer 4411 comprising $In_{0.15}Ga_{0.85}N$ and having a thickness of about 3 nm and its respective two quantum barrier layers 4412 comprising GaN and having a thickness of about 10 nm. Each second quantum well 4430 comprises a second quantum well layer 4431 comprising $In_{0.25}Ga_{0.75}N$ and having a thickness of about 3 nm and respective two quantum barrier layers 4432 comprising GaN and having a thickness of about 10 nm. A current spreading layer (CSL) 470 is formed on the p-GaN layer 460, a p-contact 480 is formed on the CSL 470 and a n-contact 490 is formed on the n-GaN layer 430.

The LED of Example 1 was fabricated as follows. Firstly, a stack of semiconductor layers was formed on the substrate 410 by metalorganic chemical vapor deposition, wherein the stack of semiconductor layers comprised, in overlying sequence, the buffer layer 420, the n-GaN layer 430, the MQW active region 440, the electron blocking layer 450 and the p-GaN layer 460. Secondly, the active area of the LED is defined by etching a portion of the stack of semiconductor layers from the p-GaN layer 460 to the n-GaN layer 430 using a dry etching method (e.g. inductively coupled plasma etching) with a dry etching mask (e.g., photoresist, $SiO_2$, $Si_3N_4$, Ni or Cr). Thirdly, a current spreading layer (e.g., indium tin oxide or Ni/Au) was deposited onto the surface of p-GaN layer 460 followed by rapid thermal annealing process to form an ohmic contact to p-GaN layer 460. Fourthly, Ti/Al-based metal stacks were deposited on both n-GaN layer 430 and the annealed current spreading layer 470 as the n-contact 470 and p-contact 480, respectively.)

Figure 4B:
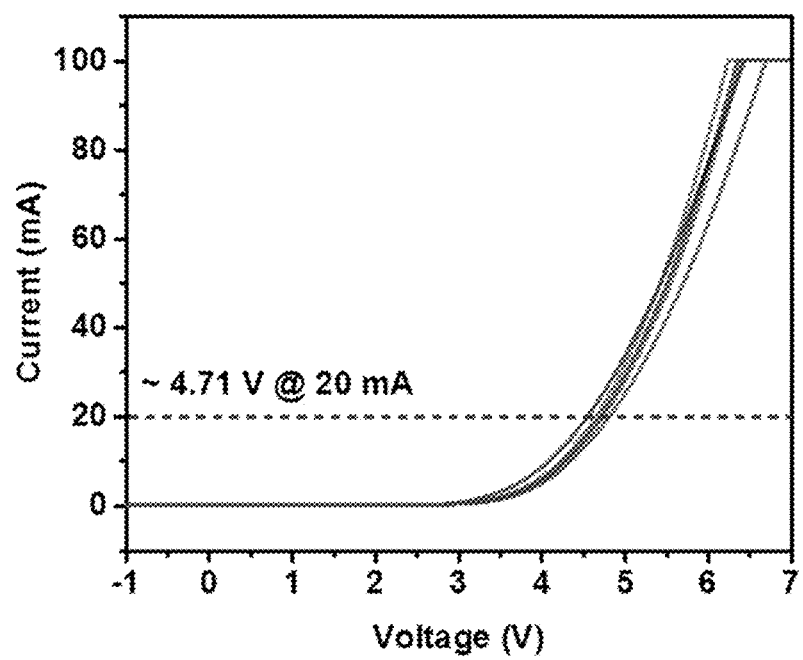
FIG. 4B shows I-V curves of five of the LEDs.
Figure 4C:
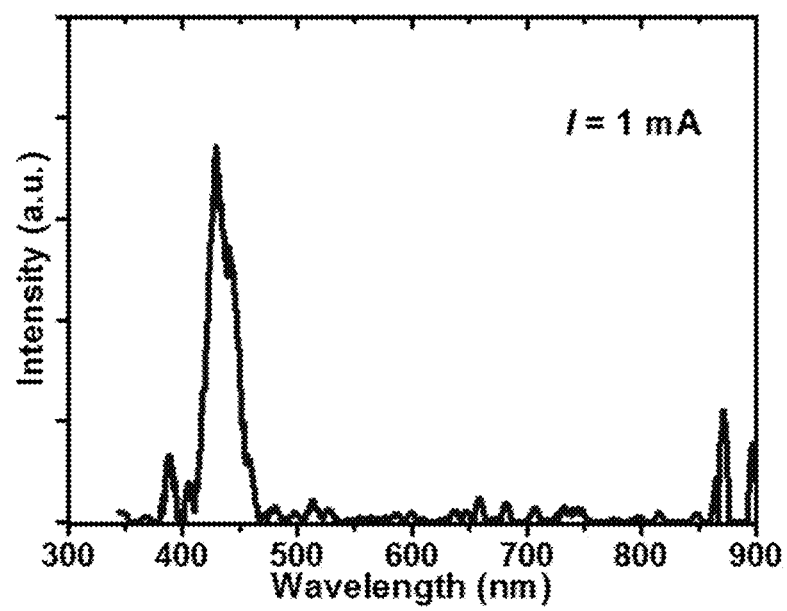
FIG. 4C shows an electroluminescence spectrum of light emitted from the LED driven by a current of 1 mA.
Figure 4D:
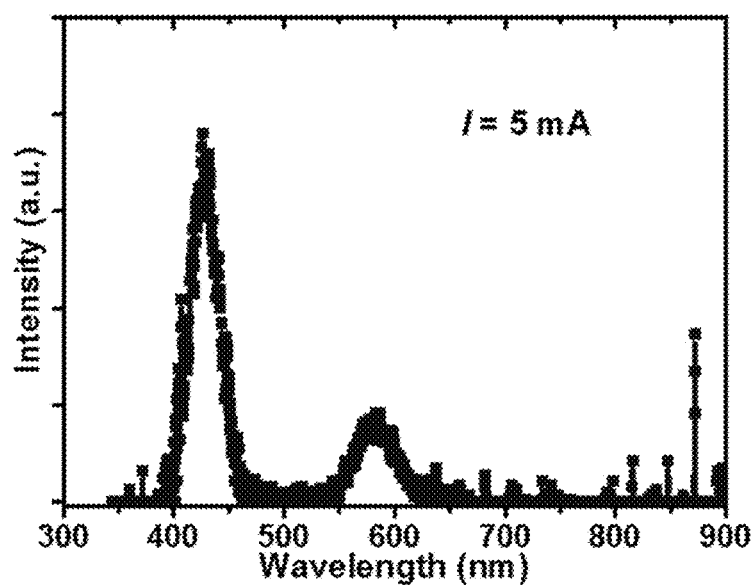
FIG. 4D shows an electroluminescence spectrum of light emitted from the LED driven by a current of 5 mA.
Figure 4E:
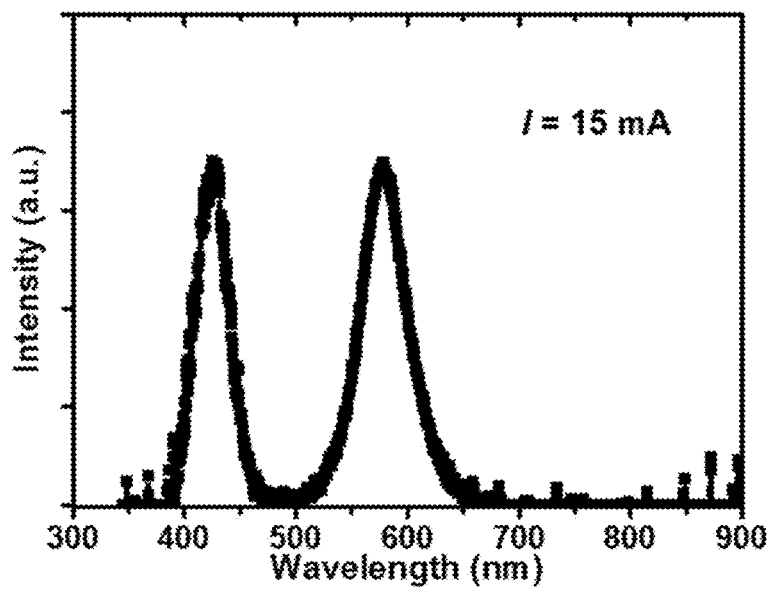
FIG. 4E shows an electroluminescence spectrum of light emitted from the LED driven by a current of 15 mA.
Figure 4F:
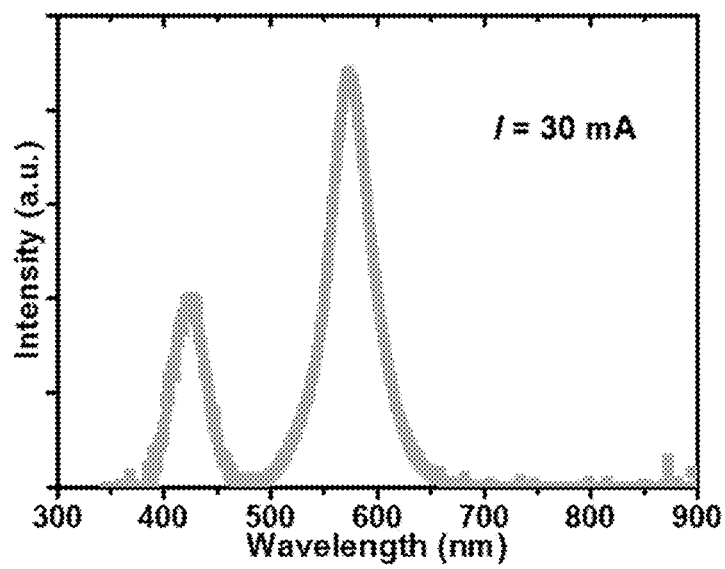
FIG. 4F shows an electroluminescence spectrum of light emitted from the LED driven by a current of 30 mA.
Figure 4G:
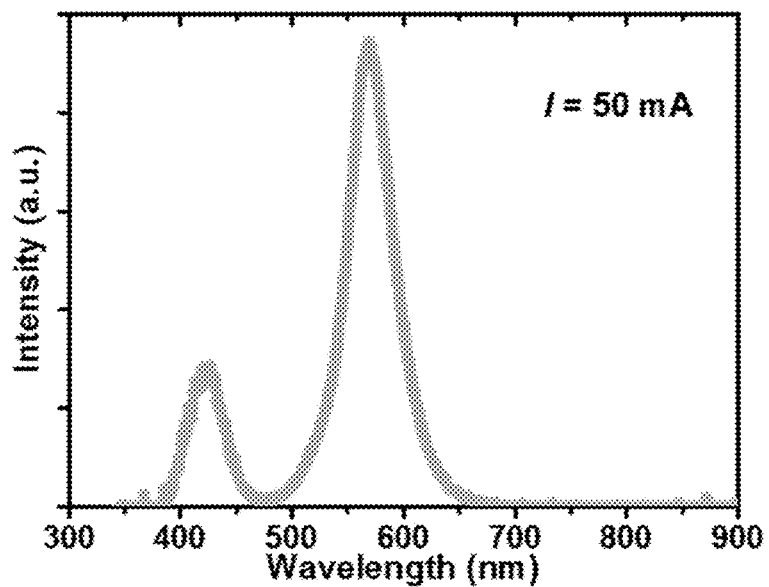
FIG. 4G shows an electroluminescence spectrum of light emitted from the LED driven by a current of 50 mA.
Figure 4H:
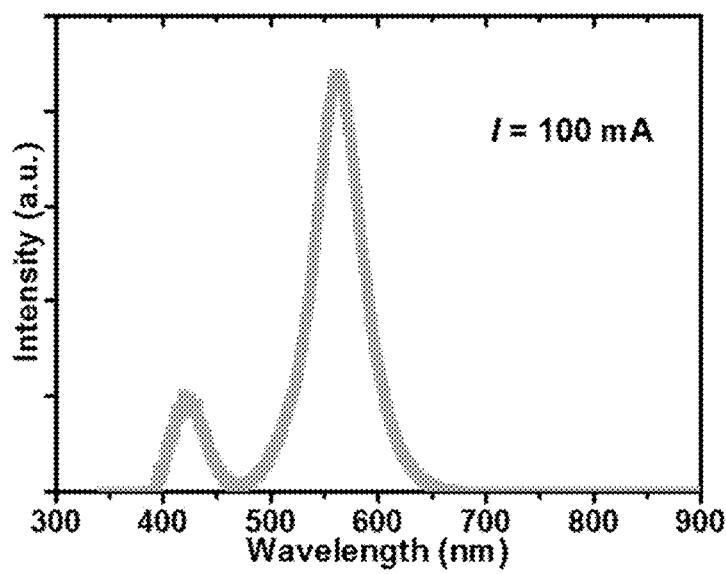
FIG. 4H shows an electroluminescence spectrum of light emitted from the LED driven by a current of 100 mA.
Figure 4I:
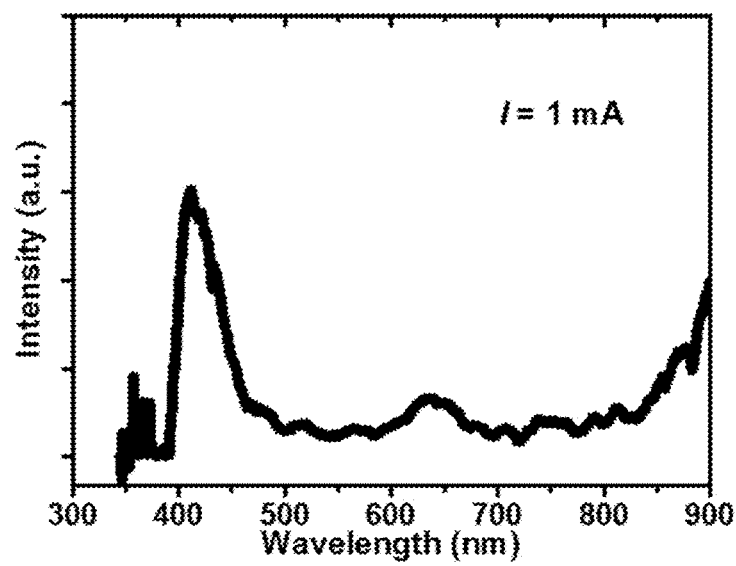
FIG. 4I shows an electroluminescence spectrum of light converted by a color converting layer when the LED was driven by a current of 1 mA.
Figure 4J:
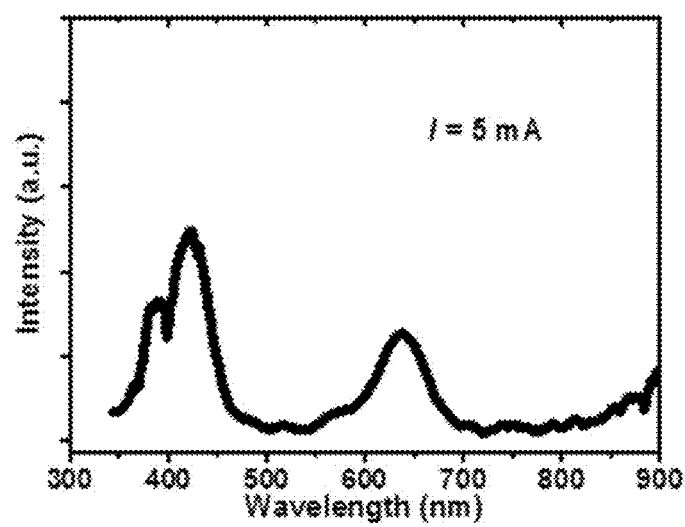
FIG. 4J shows an electroluminescence spectrum of light converted by a color converting layer when the LED was driven by a current of 5 mA.
Figure 4K:
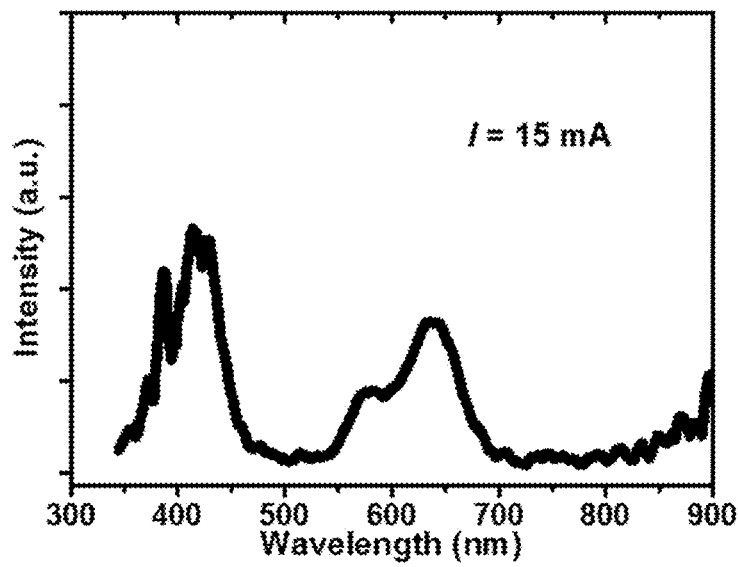
FIG. 4K shows an electroluminescence spectrum of light converted by the color converting layer when the LED was driven by a current of 15 mA.
Figure 4L:
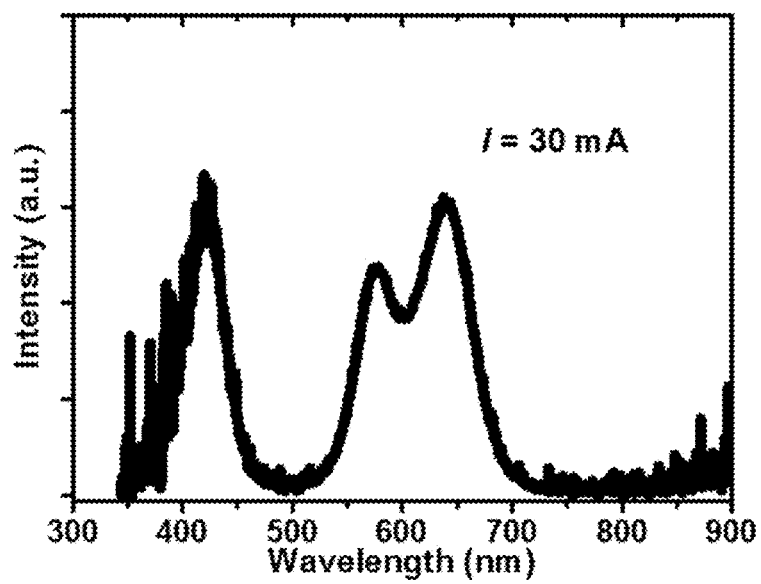
FIG. 4L shows an electroluminescence spectrum of light converted by the color converting layer when the LED was driven by a current of 30 mA.
Figure 4M:
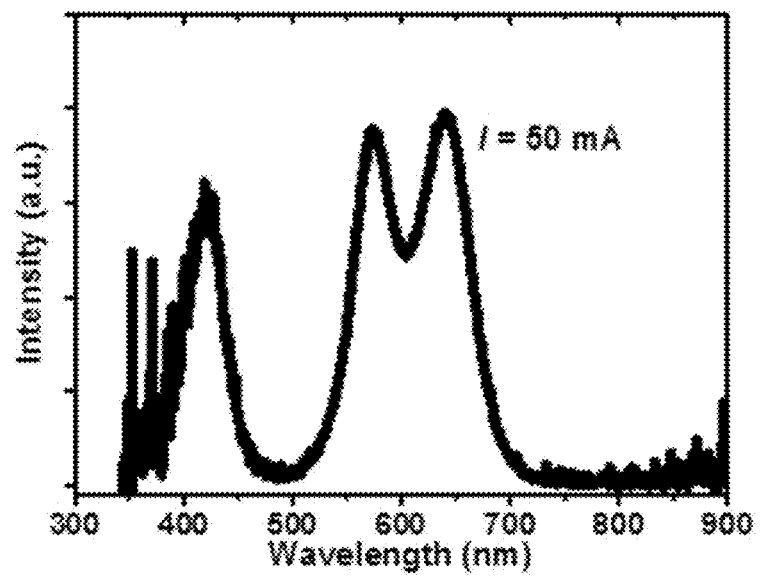
FIG. 4M shows an electroluminescence spectrum of light converted by the color converting layer when the LED was driven by a current of 50 mA.
Figure 4N:
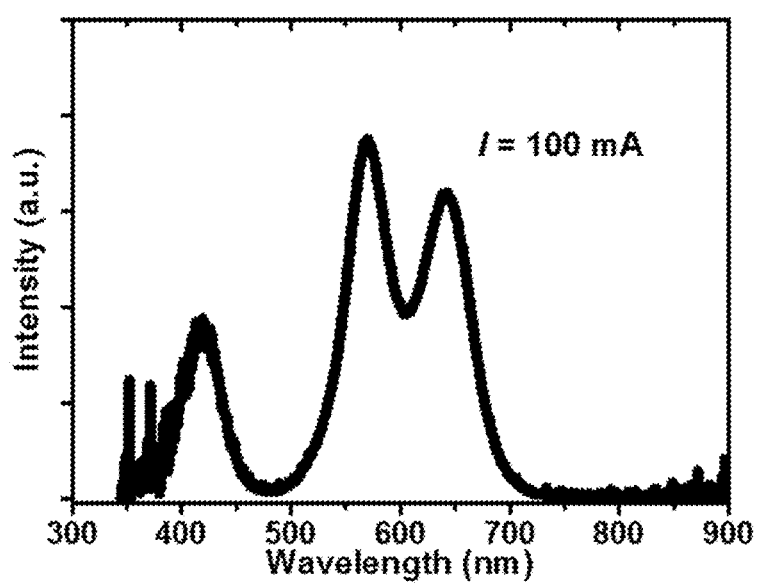
FIG. 4N shows an electroluminescence spectrum of light converted by the color converting layer when the LED was driven by a current of 100 mA.

FIG. 4B shows I-V curves of five of the LEDs. As shown in the I-V curves, the voltage across the LEDs is about 4.71V at 20 mA.

FIGS. 4C-4H show electroluminescence spectrums of light emitted from the LED driven by currents of 1, 5, 15, 30, 50 and 100 mA (corresponding to 1.25, 6.25, 18.75, 37.5, 62.5 and 125 A/cm$^2$ as the active area of the LED is 0.008 cm$^2$) according to Example 1. The light emitted from the LED has two emission peaks at 430 nm and 575 nm respectively. When a low current (e.g., 1 mA) is applied, the intensity of the light having the emission peak at 430 nm is much higher than that of the light having the emission peak at 575 nm. In contrast, when a high current (e.g., 100 mA) is applied, the intensity of the light having the emission peak at 575 nm is much higher than that of the light having the emission peak at 430 nm. In this embodiment, by controlling the current density for driving the LED, the light of a first primary color having the emission peak at 430 nm or a seconding primary color having the emission peak at 575 nm can be obtained.

FIGS. 4I-4N show electroluminescence spectrums of light converted by a color converting layer when the LED was driven by currents of 1, 5, 15, 30, 50 and 100 mA (corresponding to 1.25, 6.25, 18.75, 37.5, 62.5 and 125 A/cm$^2$ as the active area of the LED is 0.008 cm$^2$). The color converting layer comprises CdSe/ZnS QDs, which substantially convert blue light to red light having an emission peak about 630 nm. When a low current (e.g., 1 mA) is applied, there is no obvious emission peak in the red region of the light spectrum since the intensity of blue light generated by the LED is too low. In contrast, when a higher current (e.g., starting from 15 mA) is applied, there is an obvious emission peak at 630 nm since the intensity of the blue light is substantially increased. In this embodiment, by driving the LED with a higher current (e.g., starting from 15 mA), the light of red as a third primary color is generated. In certain embodiments, a third range of current density for driving a third LED to emit blue light (corresponding to a first primary color) can be between 20 and 150 A/cm$^2$ such that the intensity of blue light is large enough for being converted to red light (corresponding to a third primary color) with high intensity by the color converting layer.

Example 2

A LED array was fabricated and tested in Example 2 for its electroluminescence. Each LED of the LED array was formed with substantially the same semiconductor structure of the LED of FIG. 4A on a wafer. The fabrication steps of the LED array of Example 2 (substantially similar to the steps of FIG. 8A-8H) are described as follows. To begin with, two steps of dry etching were involved. Firstly, the pixels of the LED array were isolated by etching GaN epilayers in trenches down to the buffer layer using 1-μm-thick SiO$_2$ as dry etching mask, leaving an etching depth over 3 μm. Secondly, the active area of each pixel was defined by etching GaN epilayers down to n-doped GaN. After the dry etching, the current spreading layer (CSL, e.g., indium tin oxide, 115 nm or Ni/Au, 5/5 nm) was deposited onto the surface of p-doped GaN followed by rapid thermal annealing process to form ohmic contact to p-GaN. In this annealing process, the ITO was first annealed in O$_2$ atmosphere at 600° C. for 300 s followed by N$_2$ at 750° C. for 30 s. If Ni/Au was used as CSL, the annealing was performed in air atmosphere at 570° C. for 300 s. To form n-contact layers onto the n-doped GaN, considering the etching trench over 3 μm in depth, the first passivation layer was required to planarize the trenches with opening on n-contact and p-contact areas. The passivation material of the passivation layer can be a hard-baked photo-sensitive organic material (e.g., benzocyclobutene-based polymers (BCB), epoxy-based negative photoresist (SU8) or polyimide) or an inorganic material (e.g., SiO$_2$, Si$_3$N$_4$, Al$_2$O$_3$, ZrO$_2$ or NiF$_2$). Then, the Ti/Al-based metal stacks (Ti/Al/Ti/Au, 20/2000/50/50 nm) were evaporated onto the n-GaN as n-contact. The second passivation layer was deposited to isolate the n-contact and p-contact using the same passivation material with opening on p-contact areas. After the second passivation step, the same metal stacks (Ti/Al/Ti/Au, 20/2000/50/50 nm) can be evaporated again as p-contact. The red light emitting CdSe/ZnS QDs with emitting wavelength of 630 nm was mixed with photoresist and then patterned onto the surface of red sub-pixel. The QDs was firstly dissolved in toluene (50 mg/mL), then, the mixture was mixed with a commercially-available photoresist (product no. EOCl30) by 1:1. The thickness of this QDs layer was around 1 μm. Another method to pattern QDs on the pixels can be jet printing. After the red light emitting QDs patterning, the red, green and blue color filters were coated and patterned onto red, green and blue sub-pixels independently. The thickness of the color filters is about 1 μm. Finally, the LED array was bonded with the driving circuits by wire bonding with p-contact lines wire-bonded to scan drivers and n-contact lines wire-bonded to a data driver.

Figure 5:
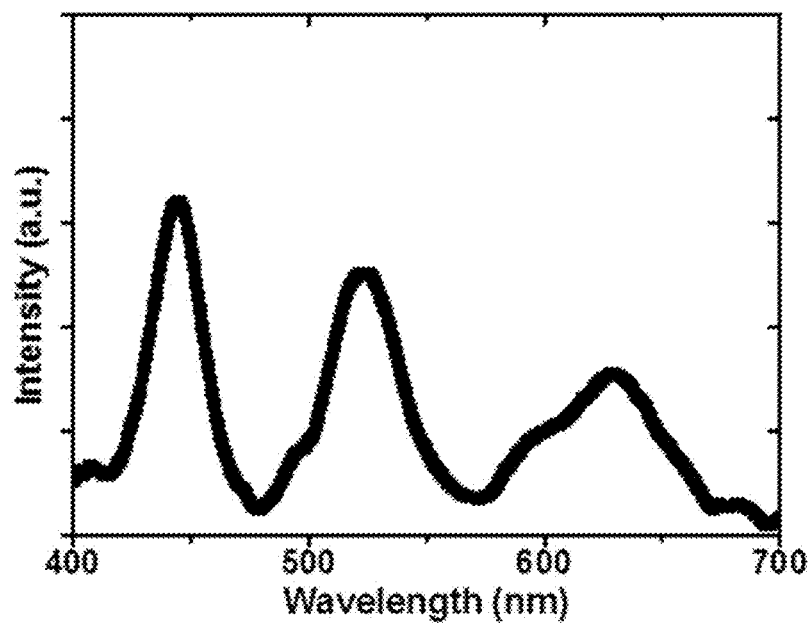
FIG. 5 shows an electroluminescence spectrum of light emitted from a LED array according to Example 2 when each first, second and third. LEDs of the LED array were driven by currents of 1 mA, 10 mA and 10 mA respectively.

FIG. 5 shows an electroluminescence spectrum of light emitted from the LED array when each first, second and third LEDs of the LED array were driven by currents of 0.5 mA, 5 mA and 5 mA respectively. Emission peaks at 445 nm, 525 nm and 630 (corresponding to a first, second and third primary colors respectively) coexist in the electroluminescence spectrum. By varying the intensities of light emission of the first, second and third LEDs in each pixel, each pixel can provide different resultant colors.

Figure 6A:
FIG. 6A shows a photo of the LED array driven by a current of 1 A according to Example 2.
Figure 6B:
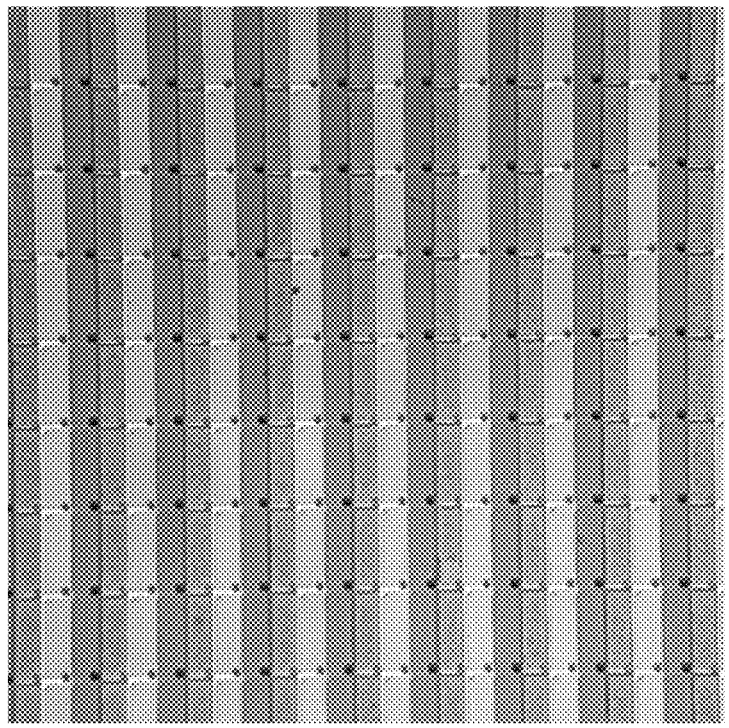
FIG. 6B shows a photo of the LED array.
Figure 6C:
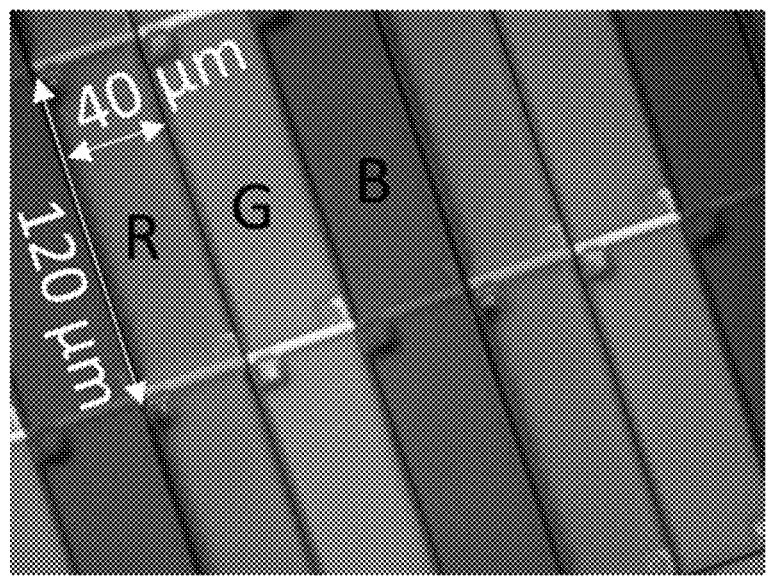
FIG. 6C shows a photo of the LED array in a magnified scale.

FIG. 6A shows a photo of the LED array driven by a total current of 1 A (corresponding to an average current density of 20 A/cm$^2$ as the area of powered-on LEDs in the array is 0.05 cm$^2$). Three primary colors including blue, green and red are shown in the photo. FIG. 6B shows a photo of the LED array. FIG. 6C is a photo showing the LED array in a magnified scale. The red/green/blue sub-pixels are all in size of 40 μm×120 μm, correspondingly, a full-color pixel is in size of 120 μm×120 μm.

Figure 7:
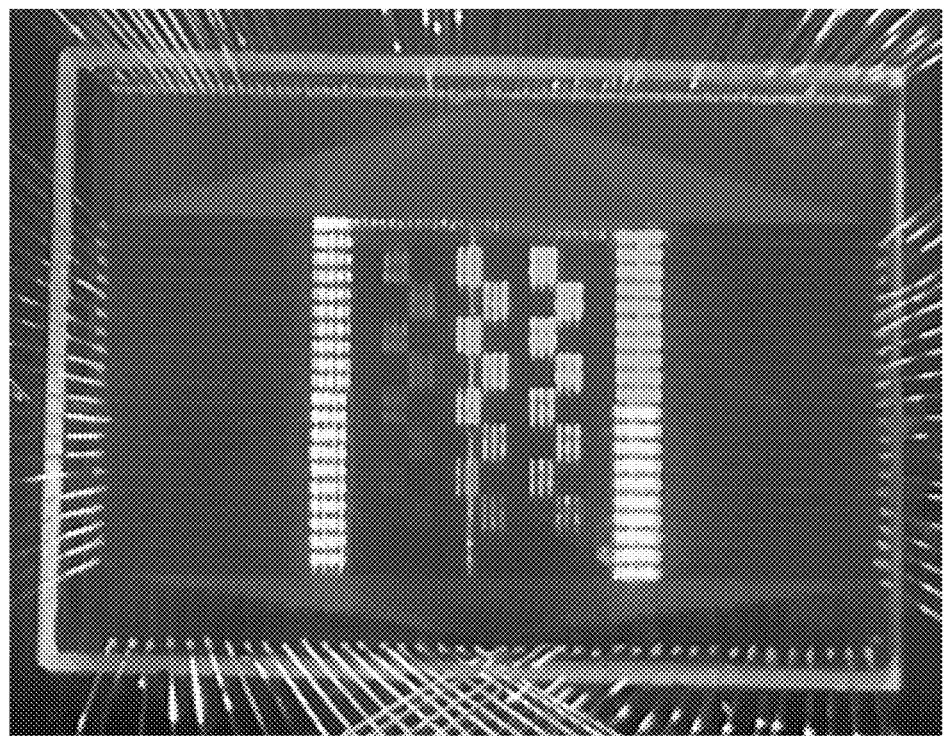
FIG. 7 shows a photo of a display image of the LED array with resolution of 40×40 according to Example 2.

FIG. 7 shows a photo of a display image having different colors with a resolution of 40×40 pixels according to Example 2.

Figure 8A:
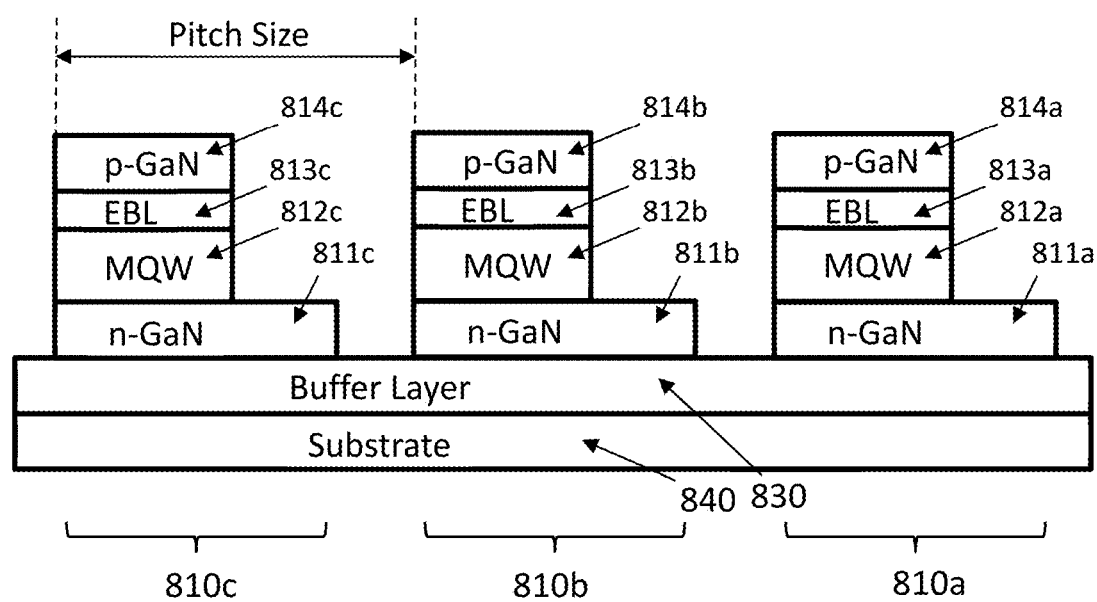
FIG. 8A depicts a cross-sectional view of an exemplary device structure illustrating a first fabrication step for fabricating the topside-emitting micro-LED array according to certain embodiments.
Figure 8B:
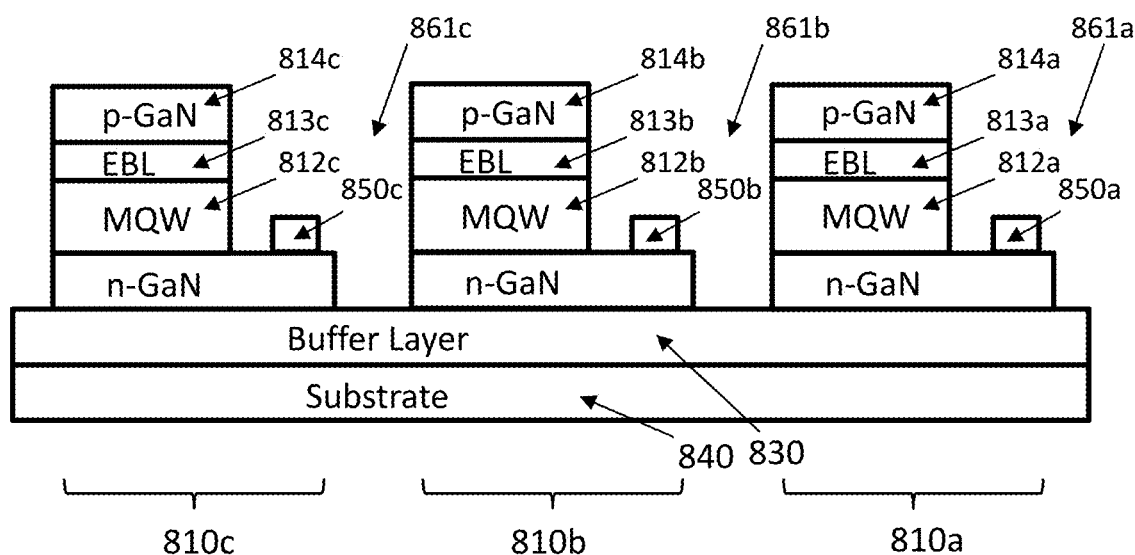
FIG. 8B depicts a cross-sectional view of an exemplary device structure illustrating a second fabrication step for fabricating the topside-emitting micro-LED according to certain embodiments.
Figure 8C:
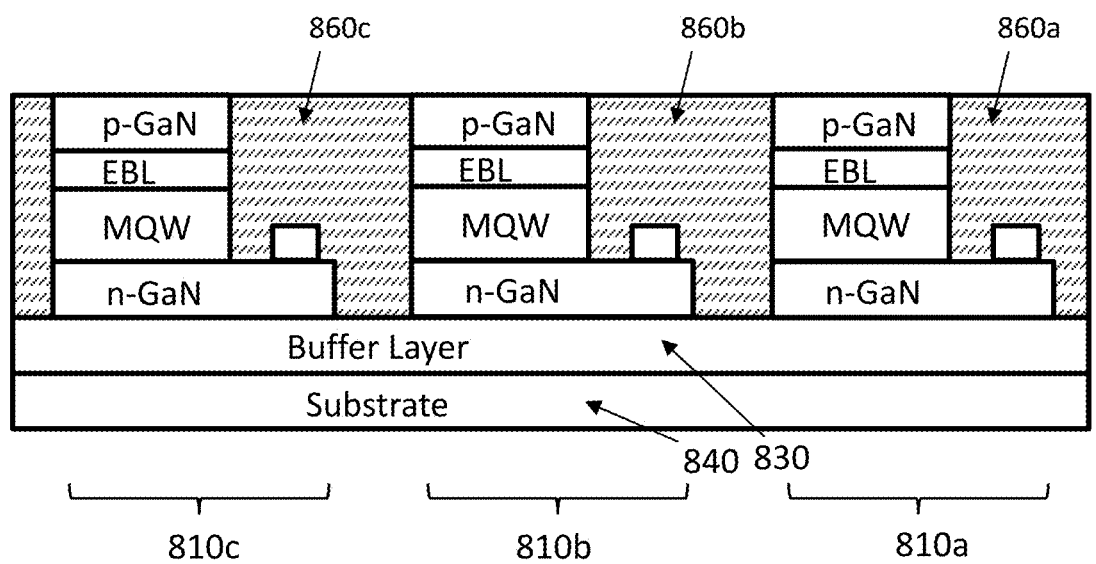
FIG. 8C depicts a cross-sectional view of an exemplary device structure illustrating a third fabrication step for fabricating the topside-emitting micro-LED according to certain embodiments.
Figure 8D:
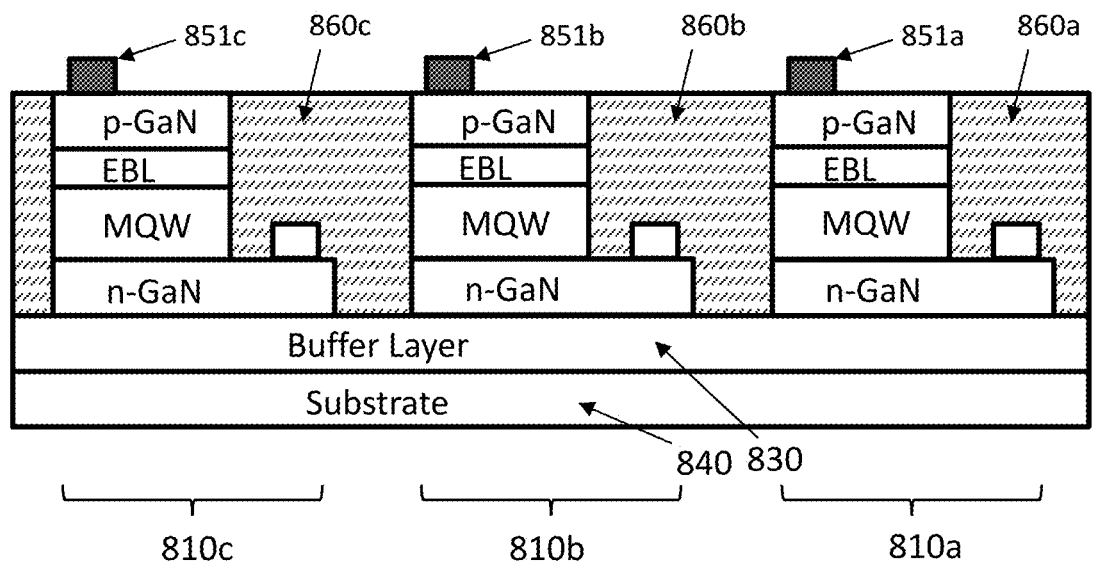
FIG. 8D depicts a cross-sectional view of an exemplary device structure illustrating a fourth fabrication step for fabricating the topside-emitting micro-LED according to certain embodiments.

Referring to FIGS. 8A-8D, various fabrication steps corresponding to a method, of fabricating a topside-emitting micro-LED array in accordance with certain embodiments of the present disclosure is depicted. For FIGS. 8E-8H, the steps for realizing full-color micro-LED array based on the topside-emitting micro-LED array of FIG. 8D are depicted. In the figures, cross-sectional views of an exemplary device structure after various fabrication steps are shown.

As illustrated in FIG. 8A, a buffer layer 830 is first formed on and covering a substrate 840. Three LEDs are then fabricated on the buffer layer 830, forming a first LED 810a, a second LED 810b, and a third LED 810b. The pitch size of the three LEDs are the same, in a range between 1 μm to 300 μm depending in accordance with the application. The partially formed first LED 810a is formed by growing a first n-GaN layer 811a, a first MQW active region 812a, a first electron blocking layer 813a, and a first p-GaN layer 814a thereon. The partially formed second LED 810b is formed by growing a second n-GaN layer 811b, a second MQW active region 812b, a second electron blocking layer 813b, and a second p-GaN layer 814b thereon. The partially formed third LED 810c is formed by growing a third n-GaN layer 811c, a third MQW active region 812c, a third electron blocking layer 813c, and a third p-GaN layer 814c thereon. In certain embodiments, an optional CSL (not shown in the figures) can be formed on each of the p-GaN layers. The above stack of semiconductor layers can be formed on the buffer layer by metalorganic chemical vapor deposition or molecular-beam epitaxy.

In one implementation, the three LEDs can be formed by first growing an n-GaN layer, a MQW active region, an electronic blocking layer, and a p-GaN layer on the buffer layer 830 by metalorganic chemical vapor deposition to obtain a semiconductor structure. In one embodiment, the n-GaN layer is a Si-doped GaN layer and the p-GaN layer is an Mg-doped GaN layer. By dry etching technique (e.g., plasma etching), portions of the semiconductor structure are removed to form isolation trenches 861a, 861b, 861c (shown in FIG. 8B) such that the p-n structures of the LEDs are isolated and defined to obtain the three plateau portions of LEDs 810a, 810b, 810c as illustrated in FIG. 8A. The cross-sectional width of the n-GaN layer is typically between 2 μm to 3 μm, which is greater than the cross-sectional width of approximately 200 nm in the p-GaN layer, electron blocking layer, and MQW active region. The MQW active region further comprises a first quantum well stack, a second quantum well stack, and an intermediate carrier blocking layer sandwiched between the first quantum well stack and the second quantum well stack. The etching process may include forming a photoresist layer over the semiconductor structure, patterning the photoresist with openings that expose a portion of the semiconductor structure, and etching material from the semiconductor structure. The typical mask used for dry etching can be, but not limited to, silicon dioxide ($SiO_2$) mask or silicon nitride ($Si_3N_4$) mask. Alternatively, the etching process can be a wet etching process, or a combination of dry etching and wet etching. Lithography process may be included to facilitate the etching process. The lithography process may comprise photoresist coating, soft baking, mask aligning, exposure, post-exposure baking, developing photoresist, rinsing, drying, other suitable processes, or any combinations thereof. In other embodiments, the lithography process may be implemented or replaced by other methods, e.g., electron-beam writing, maskless photolithography, and ion-beam writing. As the semiconductor structure is formed by a stack of semiconductor layers on the buffer layer and portions of the stack of semiconductor layers being etched, the first LED 810a, the second LED 810b, and the third LED 810c are formed with the same multi-layer semiconductor structure for each pixel featuring the advantageous monolithic characteristics.

As shown in FIG. 8B, n-electrodes 850a, 850b, 850c are metal stacks deposited onto the n-GaN layer. This is an ohmic contact fabricated on the n-type GaN surface exhibiting a low contact resistivity. Lithography process is used to deposit metals thereon. In certain embodiments, each of the n-electrodes 850a, 850b, 850c is a stack of metals including, but not limited to, Ti and Al. Typically, the metal stack is obtained by depositing 50 nm of Au, 50 nm of Ti, 200 nm of Al, and 20 nm of Ti onto the n-GaN layer, to obtain a stack of Ti/Al/Ti/Au with thickness of 20/200/50/50 nm.

Referring to FIG. 8C, the isolation trenches 861a, 861b, 861c between the plurality of LEDs are filled by patterning passivation layers 860a, 860b, 860c through lithography process. The passivation layers 860a, 860b, 860c are photo-sensitive organic layer deposited for separating the plateau portions of the LEDs and protecting the n-electrodes 850a, 850b, 850c from making connecting to the p-electrodes 851a, 851b, 851c (not shown in FIG. 8C). The passivation layers 860a, 860b, 860c fill the isolation trenches 861a, 861b, 861c up to the same thickness as the entire semiconductor structure and correspond to an entire width of the isolation trenches 861a, 861b, 861c. In one example, the passivation layers 860a, 860b, 860c can be a hard-baked photo-sensitive organic material (e.g., benzocyclobutene-based polymers (BCB), epoxy-based negative photoresist (SU8) or polyimide) or inorganic material (e.g., $SiO_2$, $Si_3N_4$, $Al_2O_3$, $ZrO_2$, or $NiF_2$).

In FIG. 8D, p-electrodes 851a, 851b, 851c are deposited onto the p-GaN layers to obtain a topside-emitting micro-LED array. The p-electrodes 851a, 851b, 851c are ohmic contacts fabricated on the p-GaN surface exhibiting a low contact resistivity. Lithography process is used to deposit metals thereon. Each of the p-electrodes 851a, 851b, 851c comprises a first layer contacting the p-GaN surface and a second layer as electrode. In one example, the first layer is an annealed indium tin oxide of 100 nm. In another example, the first layer is a stack of Ni/Au of 5 nm/5 nm. For the second layer, it is a metal stack of Ti and Al as electrodes. It is appreciated that the first layer and the second layer may comprise a different material and/or with a different thickness.

Figure 8E:
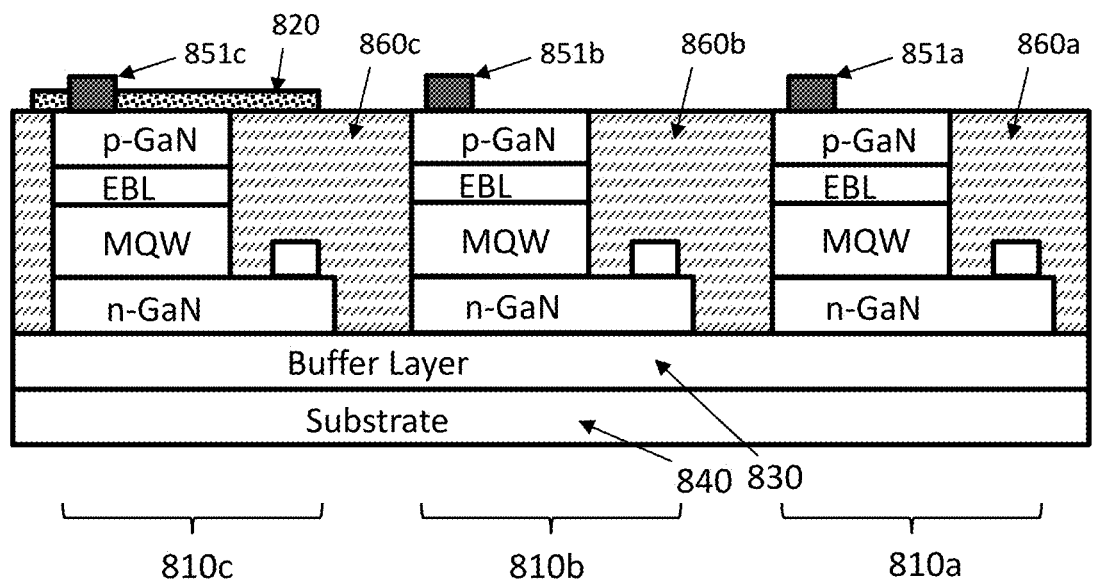
FIG. 8E depicts a cross-sectional view of an exemplary device structure illustrating a fifth fabrication step for fabricating the topside-emitting micro-LED according to certain embodiments.

Referring to FIG. 8E, a color converting layer 820 is coated on the third LED 810c at the top of the topside-emitting micro-LED array of FIG. 8D. The color converting layer 820 is used for converting the generated blue light into red light as quantum wells for emitting red light are hard to control and difficult to fabricate. Alternatively, the color converting layer 820 may be structured to convert the generated green light into red light. In one embodiment, the color converting layer 820 comprises red light emitting CdSe/ZnS quantum dots (QDs). The QD may have other core/shell structure and is not limited to the CdSe/ZnS structure. The color converting layer 820 is coated by, but not limited to the lithography process or jet printing process.

Figure 8F:
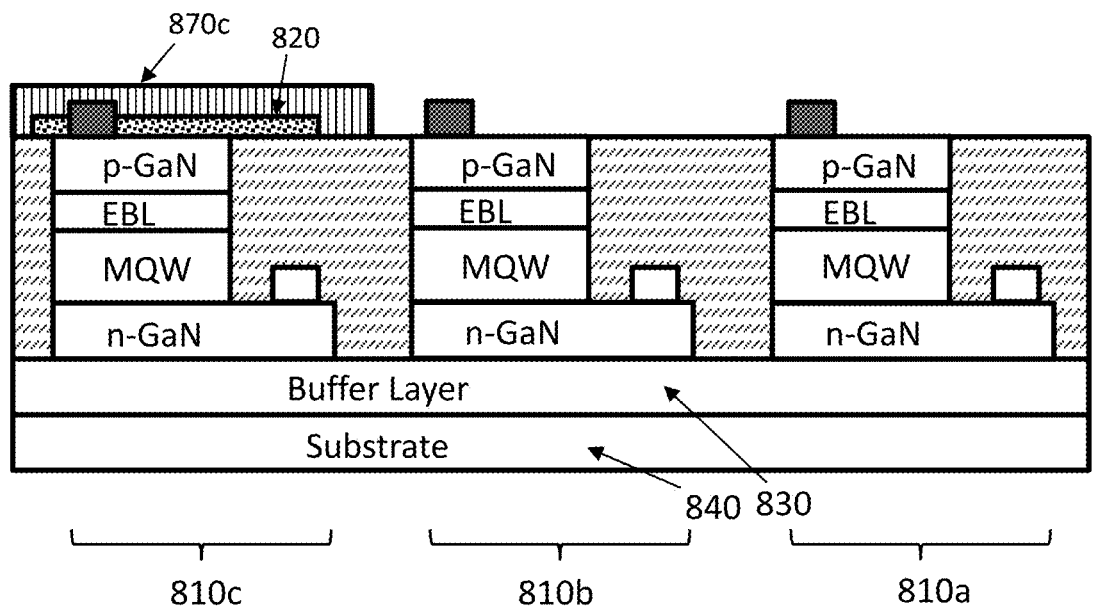
FIG. 8F depicts a cross-sectional view of an exemplary device structure illustrating a sixth fabrication step for fabricating the topside-emitting micro-LED according to certain embodiments.
Figure 8G:
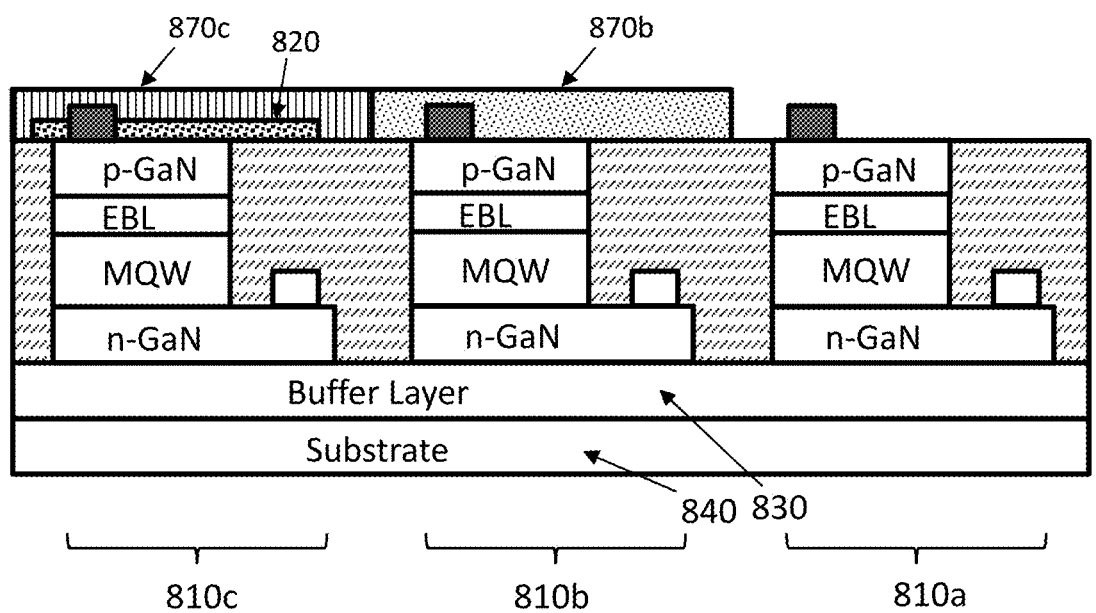
FIG. 8G depicts a cross-sectional view of an exemplary device structure illustrating a seventh fabrication step for fabricating the topside-emitting micro-LED according to certain embodiments.
Figure 8H:
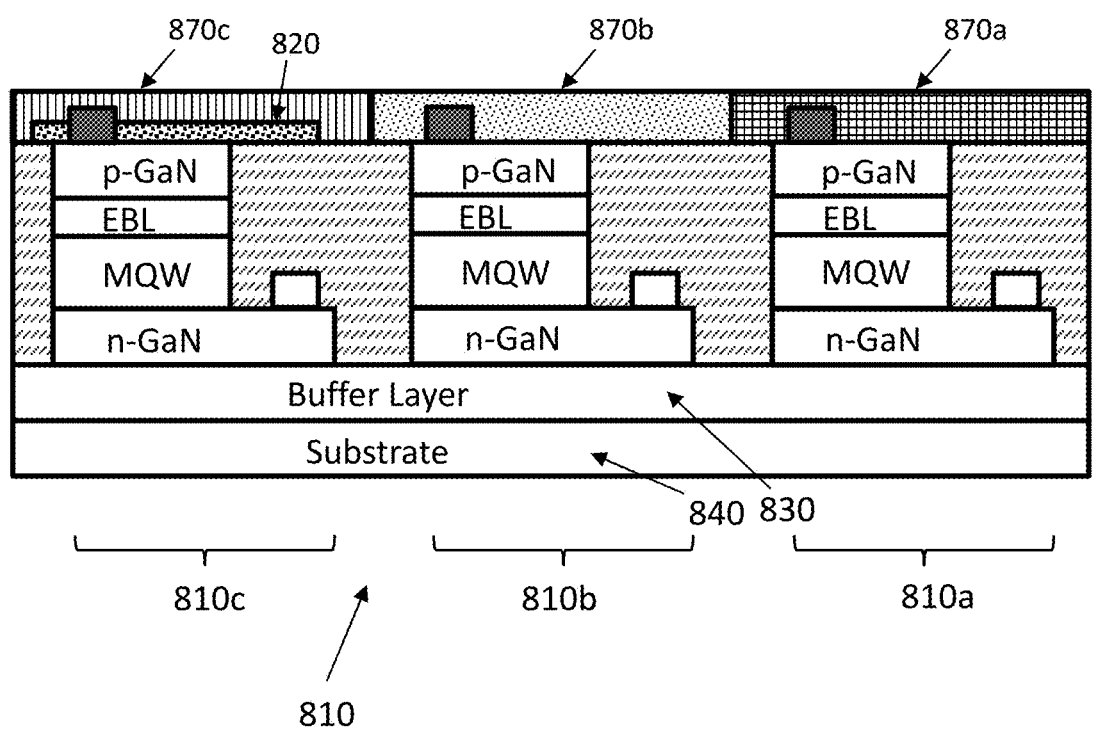
FIG. 8H depicts a cross-sectional view of an exemplary device structure illustrating an eighth fabrication step for fabricating the topside-emitting micro-LED according to certain embodiments.

FIGS. 8F-8H show the process flow for disposing three color filters on top of the semiconductor structure by lithography process for the realization of a topside-emitting full-color micro-LED pixel 810. The red color filter 870c is the highest layer on the third LED 810c covering the color converting layer 820 for transmitting red light. Similarly, the green color filter 870b and the blue color filter 870a are also the highest layers on the second LED 810b and first LED 810a for transmitting green and blue light respectively. The color filters 870a, 870b, 870c are photo-sensitive organic color filter arranged to absorb a portion of the light produced by the LEDs 810a, 810b, 810c, and permit another portion of the light to pass through. It is appreciated that many color filtering elements or structures are known in the art which can be employed in the present disclosure. The light passing through the color filters 870a, 870b, 870c may have lower brightness. Each of the three color filters 870a, 870b, 870c is arranged to cover at least a portion of the p-GaN of the corresponding LED. With the color converting layer 820 and the three color filters 870a, 870b, 870c disposed at the top of the topside-emitting micro-LED array, the topside-emitting full-color micro-LED pixel 810 can be realized and each LED can be controlled separately for the generation of the desired color.

Figure 9:
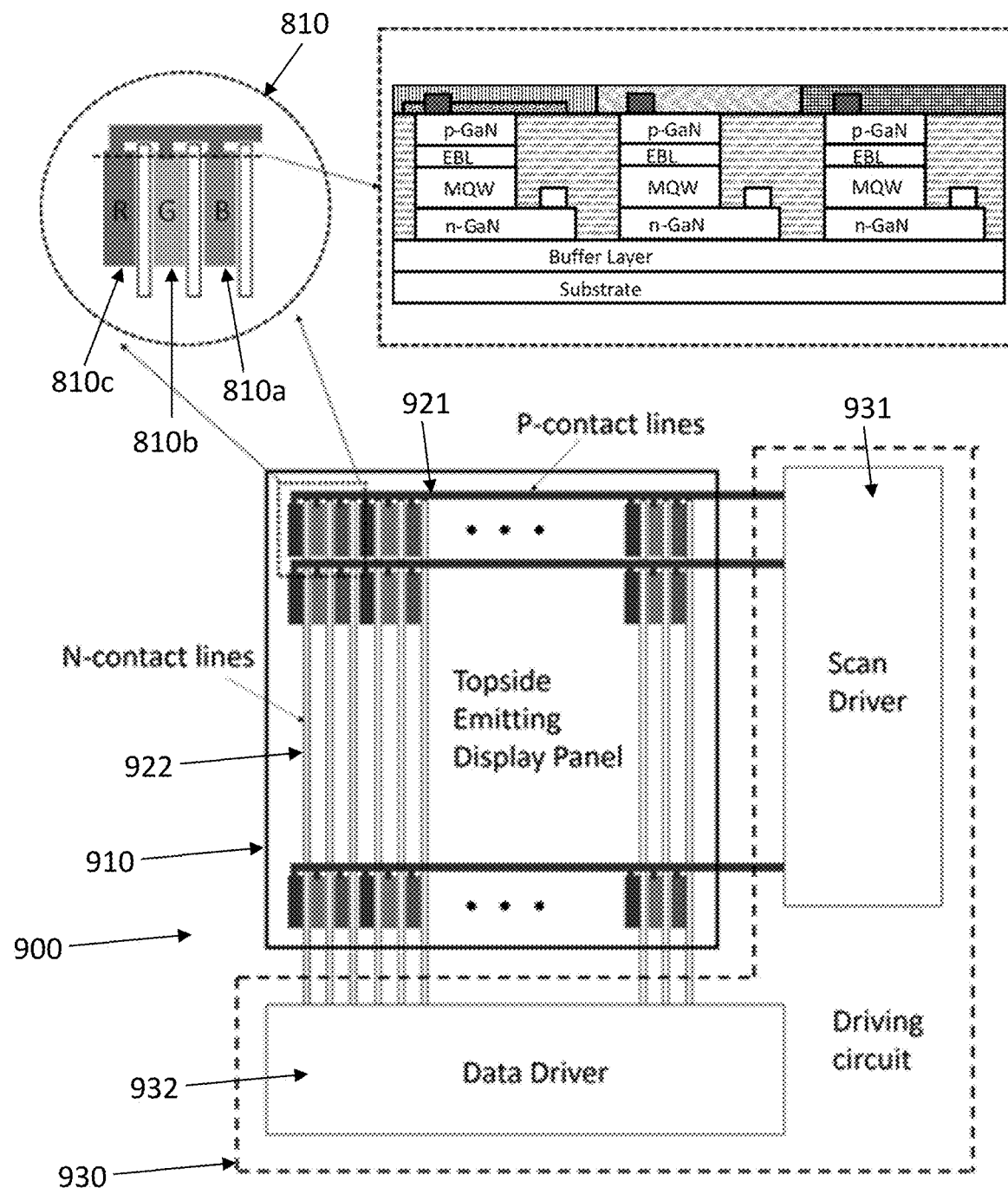
FIG. 9 depicts a passive driving scheme of a monolithic full-color display system according to certain embodiments.

FIG. 9 shows a passive-matrix driving scheme for the topside-emitting monolithic full-color micro-LED display system 900 based on the topside-emitting full-color micro-LED pixel 810 of FIG. 8H. A passive-matrix based driving circuit 930 uses a grid of conductive metal to activate pixels of a display. The monolithic full-color micro-LED display system 900 comprises a driving circuit 930 and a passive-matrix micro-LED panel 910 including a plurality of passive-matrix addressable pixels, with the structure of the topside-emitting full-color micro-LED pixel 810, arranged in an array. Each pixel further comprises a first LED 810a, a second LED 810b, and a third LED 810c.

The driving circuit 930 is configured to provide control signals to the passive-matrix micro-LED panel 910 for adjusting the current density applied to each pixel to control the emission peak. In order to control the brightness of each color, time utilizing methods are applied, e.g., PWM and PFM. The driving circuit 930 may include other circuit blocks for receiving and processing the input image or input video data for display purposes. Each of the plurality of input color in the image or video may be defined in a color format according to a color standard, e.g., an (R, G, B) color format, a (Y, U, V) color format, an (H, S, V) color format, etc. In one embodiment, the driving circuit 930 or any part therein may be encompassed within an application specific integrated circuit (ASIC), a microcontroller (MCU), a programmable logic device (PLD), a field-programmable gate array (FPGA), gate in panel (GIP) circuits, a programmable I/O device, other semiconductor devices, or a combination of any aforesaid devices. The driving circuit 930 can be formed at least partially by logic gates, analog circuit blocks, transistors, semiconductor devices, discrete components, other electronic devices, or a combination of any aforesaid circuit structures. The driving circuit 930 comprises a data driver 932 and a scan driver 931. Other circuit blocks, constant current circuit (e.g., a current mirror), and voltage regulators for driving and updating the passive-matrix micro-LED panel 910 may also be included in the driving circuit 930, which are not shown in FIG. 9. The data driver 932 and the scan driver 931 may be integrated into a single driving device or divided into a plurality of driving devices. These modifications and changes may be made without departing from the spirit of the present disclosure.

The data driver 932 and the scan driver 931 are configured to generate a plurality of control signals for driving the first LED 810a of each pixel with a first current density within the pre-identified first range of the current density for emitting light having the first primary color, the second LED 810b of each pixel with a second current density within the pre-identified second range of the current density for emitting light having the second primary color, and the third LED 810c of each pixel with a third current density for emitting light having the first primary color.

For a passive-matrix micro-LED panel 910 with LEDs arranged in m columns and n rows. For example, a passive-matrix micro-LED panel 910 with resolution of 40×40 pixels has 120 columns and 40 rows (m=120, n=40). The p-electrodes 851a, 851b, 851c of each row are connected together by a scan line 921 made of ITO or other metal stacks, e.g., Ti, Ni, Al, Au or any combinations like Ti/Al/Ti/Au, and coupled to an output of the scan driver 931. The scan driver 931 has at least n scan lines 921, each scan line 921 is individually controllable by the scan driver 931. The n-electrodes 850a, 850b, 850c of each column are connected together by a data line 922 made of ITO or other metal stacks, and coupled to an output of the data driver 932. The data driver 932 has at least m data lines 922; each data line 922 is individually controllable by the data driver 932. Each line of pixels in the passive-matrix micro-LED panel 910 is enabled line by line horizontally by supplying a driving current for a pre-determined duration as defined by the line frequency. The current density of each LED can be defined and the brightness can be adjusted using PWM or PFM, thereby the monolithic full-color micro-LED display system 900 can generate colors for each pixel according to the image or video data provided.

Figure 10A:
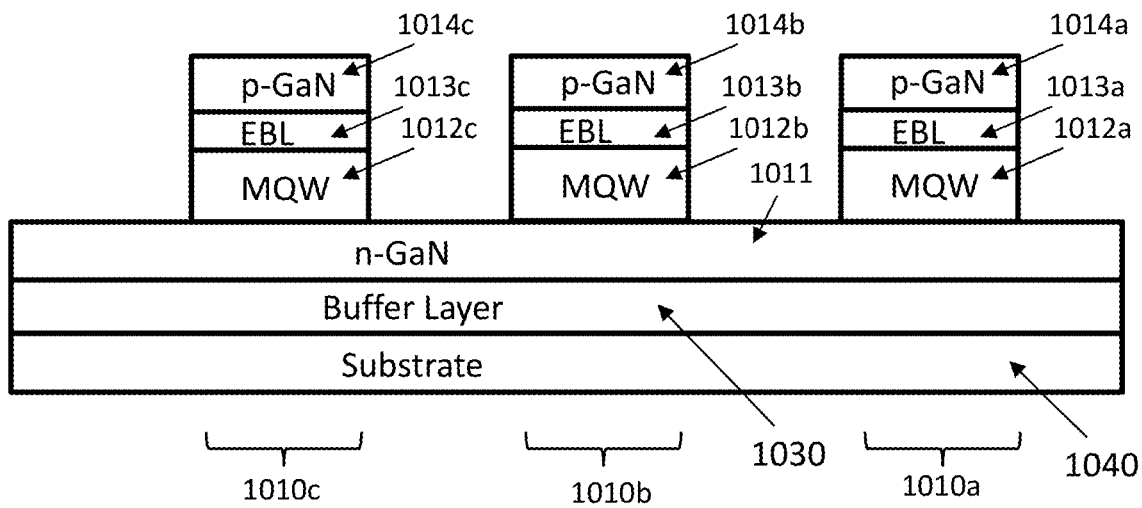
FIG. 10A depicts a cross-sectional view of an exemplary device structure illustrating a first fabrication step for fabricating the backside-emitting micro-LED array according to certain embodiments.
Figure 10B:
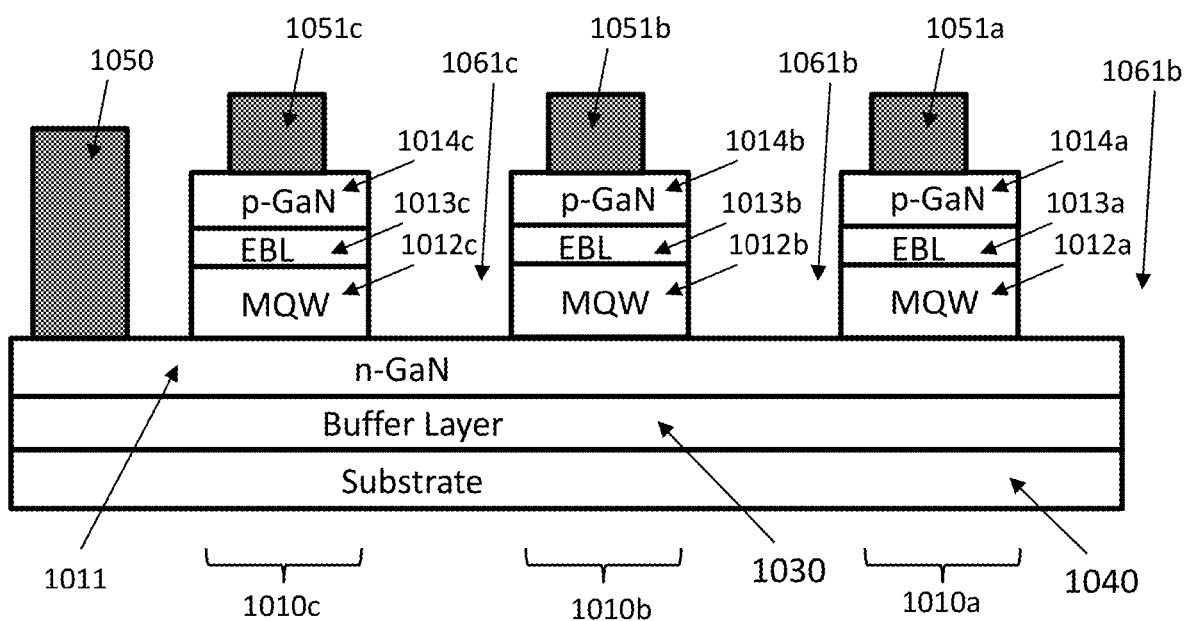
FIG. 10B depicts a cross-sectional view of an exemplary device structure illustrating a second fabrication step for fabricating the backside-emitting micro-LED according to certain embodiments.
Figure 10C:
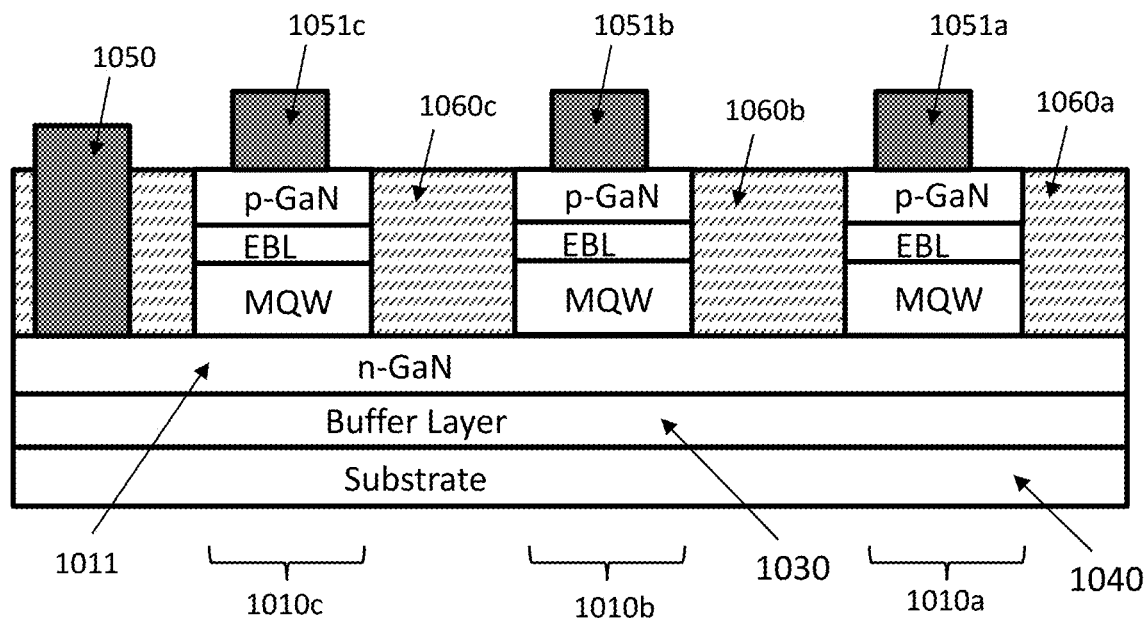
FIG. 10C depicts a cross-sectional view of an exemplary device structure illustrating a third fabrication step for fabricating the backside-emitting micro-LED according to certain embodiments.
Figure 10D:
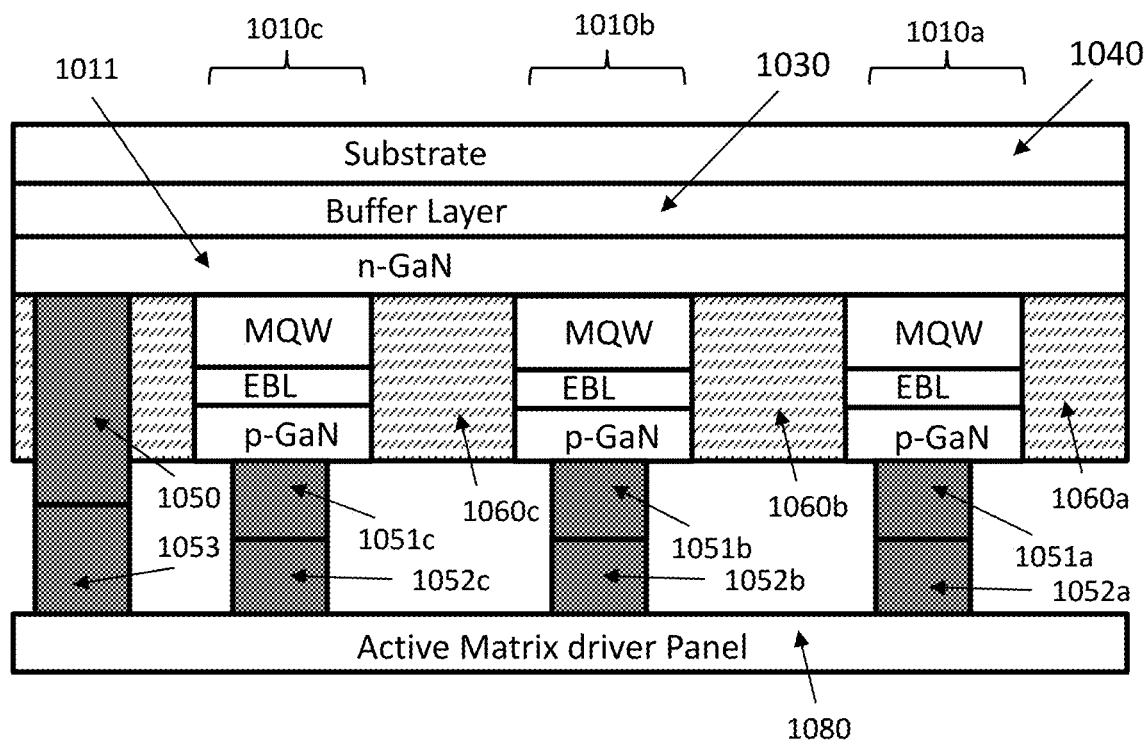
FIG. 10D depicts a cross-sectional view of an exemplary device structure illustrating a fourth fabrication step for fabricating the backside-emitting micro-LED according to certain embodiments.

Referring to FIGS. 10A-10E, various fabrication steps corresponding to a method of fabricating a backside-emitting micro-LED array in accordance with certain embodiments of the present disclosure is depicted. For FIGS. 10F-10I, the steps for realizing full-color micro-LED array based on the backside-emitting micro-LED array of FIG. 10D are depicted. In the figures, cross-sectional views of an exemplary device structure after various fabrication steps are shown.

As illustrated in FIG. 10A, a buffer layer 1030 and an n-GaN layer 1011 are first formed on and covering a substrate 1040. Three LEDs are then fabricated on the buffer layer 1030, forming a first LED 1010a, a second LED 1010b, and a third LED 1010c. The pitch size of the three LEDs is the same, in a range between 1 μm to 300 μm depending in accordance with the application. The partially formed first LED 1010a is formed by growing a first MQW active region 1012a, a first electron blocking layer 1013a, and a first p-GaN layer 1014a thereon. The partially formed second LED 1010b is formed by growing a second MQW active region 1012b, a second electron blocking layer 1013b, and a second p-GaN layer 1014b thereon. The partially formed third LED 1010c is formed by growing a third MQW active region 1012c, a third electron blocking layer 1013c, and a third p-GaN layer 1014c thereon.

In one implementation, the three LEDs can be formed by first growing a MQW active region, an electronic blocking layer, and a p-GaN layer on the n-GaN layer 1011 to obtain a semiconductor structure. In one embodiment, the n-GaN layer is a Si-doped GaN layer and the p-GaN layer is an Mg-doped GaN layer. By dry etching technique (e.g., plasma etching), portions of the semiconductor structure are removed to form isolation trenches 1061a, 1061b, 1061c (shown in FIG. 10B) such that the p-n structures of the LEDs are isolated and defined to obtain the three plateau portions of LEDs 1010a, 1010b, 1010c as illustrated in FIG. 10A.

As shown in FIG. 10B, an n-electrode 1050 is a metal stack deposited onto the n-GaN layer. Similarly, p-electrodes 1051a, 1051b, 1051c are deposited onto the p-GaN layers. They are ohmic contacts fabricated on the n-type GaN and p-type GaN surface respectively as solder bump exhibiting a low contact resistivity. Lithography process is used to deposit metals thereon. In certain embodiments, the solder bumps are formed on top of the electrode for the subsequent flip-chip bonding process. The solder bump can be metal stacks including, but not limited to, Au/In, Au/Sn, Au/Au, and Cu/Sn. It is appreciated that the solder bump may comprise a different material and/or with different thickness.

Referring to FIG. 10C, the isolation trenches 1061a, 1061b, 1061c between the plurality of LEDs are filled by patterning passivation layers 1060a, 1060b, 1060c through lithography process. The passivation layers 1060a, 1060b, 1060c are photo-sensitive organic layer deposited for separating the plateau portions of LEDs and protecting the n-electrode 1050 from making connecting to the p-electrodes 1051a, 1051b, 1051c. The passivation layers 1060a, 1060b, 1060c fill the isolation trenches 1061a, 1061b, 1061c up to the same thickness as the entire semiconductor structure and correspond to an entire width of the isolation trenches 1061a, 1061b, 1061c. In one example, the passivation layers 1060a, 1060b, 1060c can be a hard-baked photo-sensitive organic material (e.g., benzocyclobutene-based polymers (BCB), epoxy-based negative photoresist (SU8) or polyimide) or inorganic material (e.g., $SiO_2$, $Si_3N_4$, $Al_2O_3$, $ZrO_2$, or $NiF_2$).

Referring to FIG. 10D, the semiconductor device of FIG. 10C is arranged in an upside-down manner for performing flip-chip bonding onto an active-matrix driving panel 1080 based on the p-contact pads 1052a, 1052b, 1052c, and n-contact pads 1053 positioned at the mirrored positions corresponding to the p-electrodes 1051a, 1051b, 1051c and n-electrodes 1050. The flip-chip bonding is used to directly connect the array of solder bumps on the semiconductor device of FIG. 10C and the array of solder bumps on the active-matrix driver panel 1080 together. The active-matrix driving panel 1080 may be an ASIC, a MCU, a PLD, a FPGA, GIP circuits, a programmable I/O device, other semiconductor devices, or a combination of any aforesaid devices. The flip-chip bonding method may require re-flow at high temperature and certain bonding pressure.

Figure 10E:
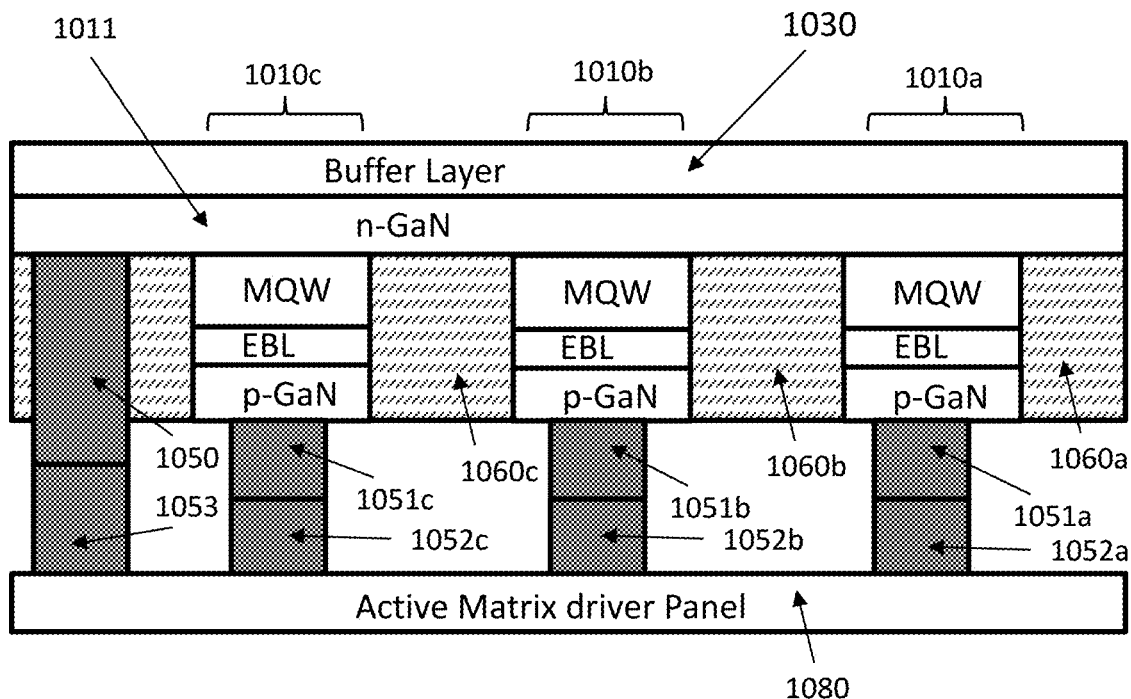
FIG. 10E depicts a cross-sectional view of an exemplary device structure illustrating a fifth fabrication step for fabricating the backside-emitting micro-LED according to certain embodiments.

After performing flip-chip bonding, the substrate 1040 material is removed as shown in FIG. 10E. Preferably, the substrate 1040 material of Si, SiC, or GaN is removed using dry etching process, while the substrate 1040 material of Sapphire is removed using laser lift off process. Other processes currently known in the art, e.g., chemical mechanical polishing (CMP) process, ion etching, wet etching, or mechanical polishing, may also be suitably employed to remove the substrate 1040 material. The buffer layer 1030 is exposed as the highest layer after etching the substrate 1040 away. The layers left are all transparent which promise a backside-emitting characteristic for light generation.

Figure 10F:
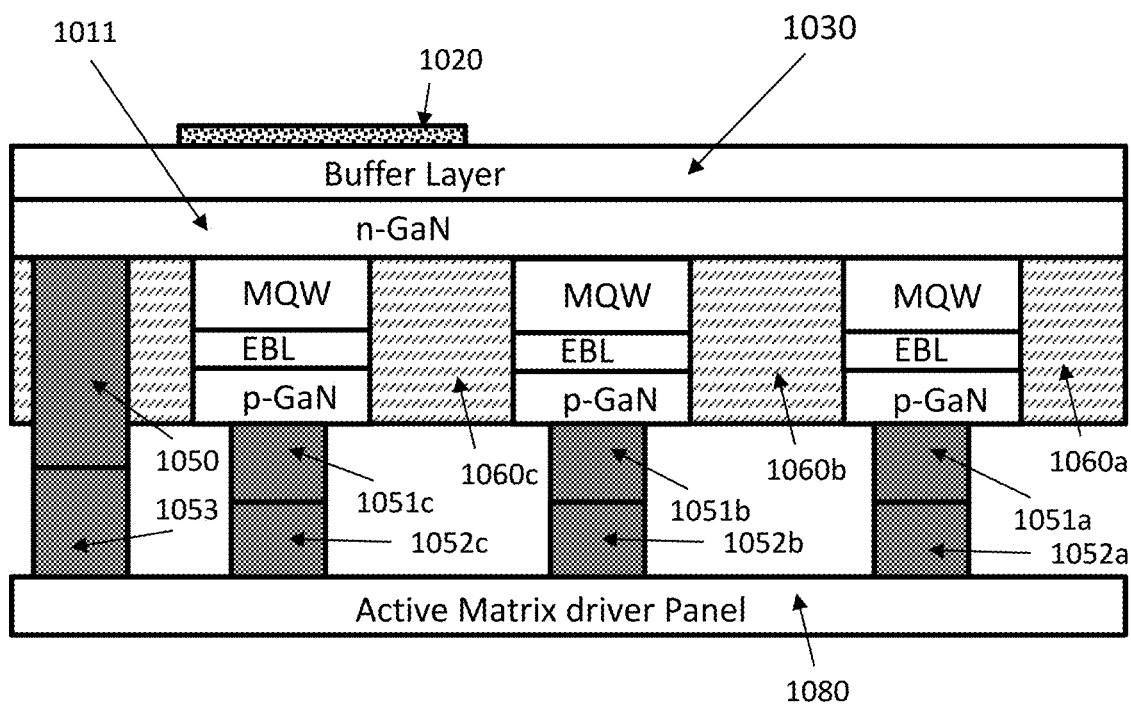
FIG. 10F depicts a cross-sectional view of an exemplary device structure illustrating a sixth fabrication step for fabricating the backside-emitting micro-LED according to certain embodiments.

Referring to FIG. 10F, a color converting layer 1020 is coated at the top of the backside-emitting micro-LED array of FIG. 10E (above the buffer layer 1030) with position correspond to the third LED 1010c. The color converting layer 1020 is used for converting the generated blue light into red light. Alternatively, the color converting layer 1020 may be structured to convert the generated green light into red light. The color converting layer 1020 for backside-emitting micro-LED array is similar to the color converting layer 820 for topside-emitting micro-LED array.

Figure 10G:
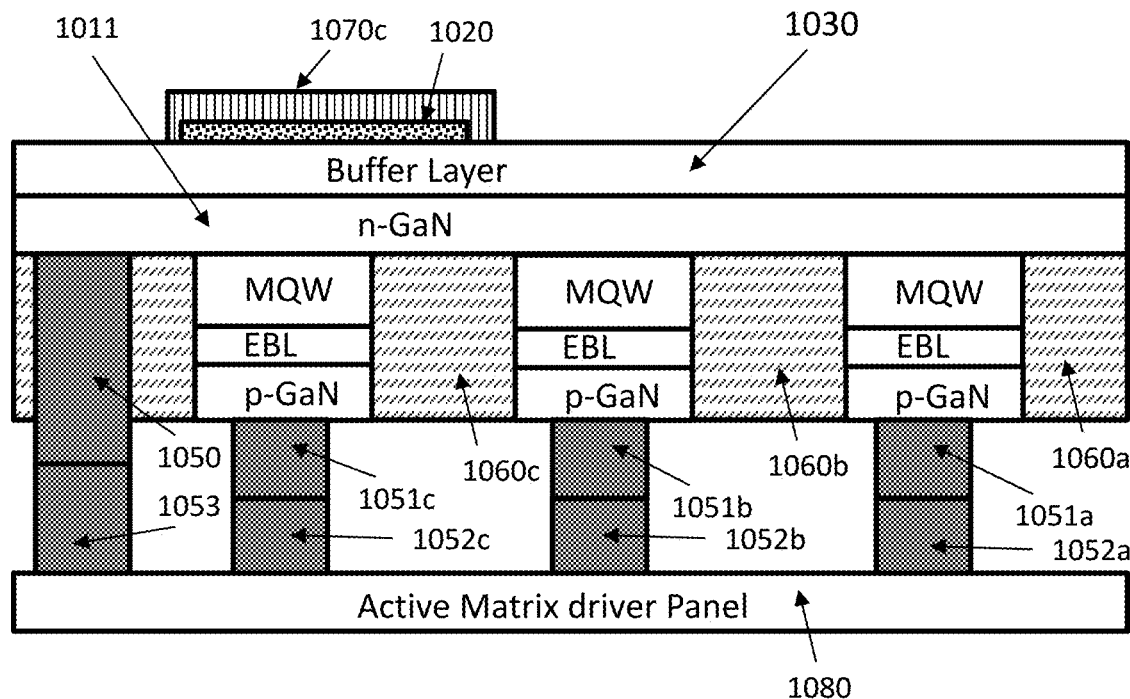
FIG. 10G depicts a cross-sectional view of an exemplary device structure illustrating a seventh fabrication step for fabricating the backside-emitting micro-LED according to certain embodiments.
Figure 10H:
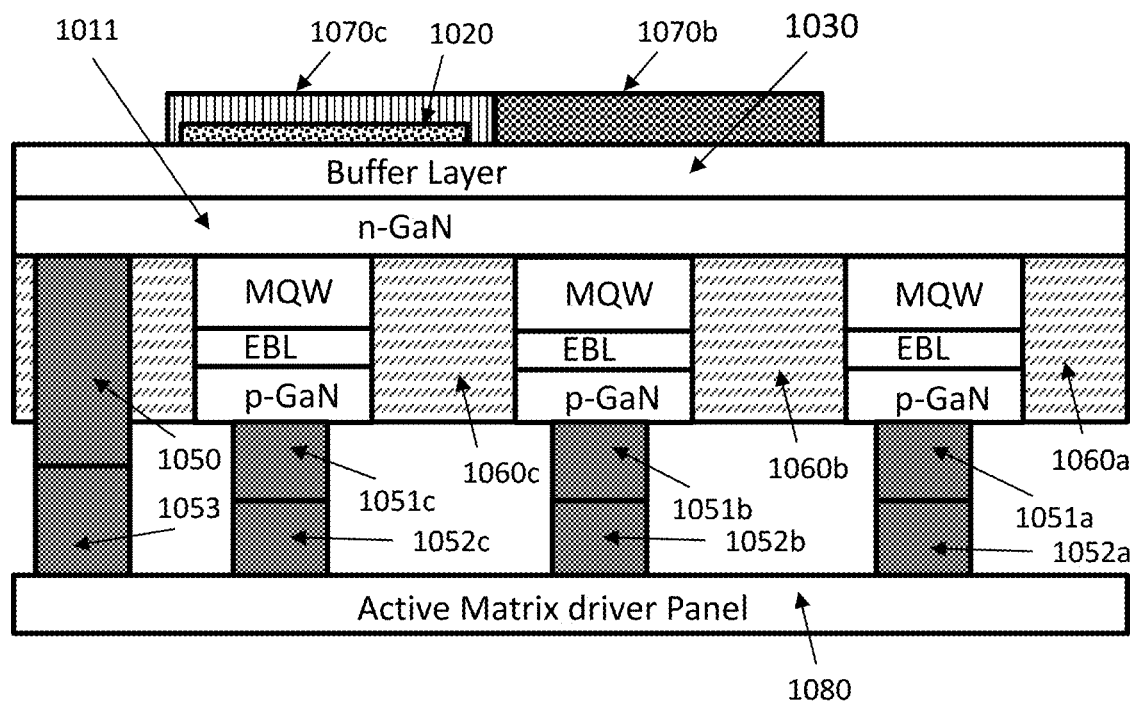
FIG. 10H depicts a cross-sectional view of an exemplary device structure illustrating an eighth fabrication step for fabricating the backside-emitting micro-LED according to certain embodiments.
Figure 10I:
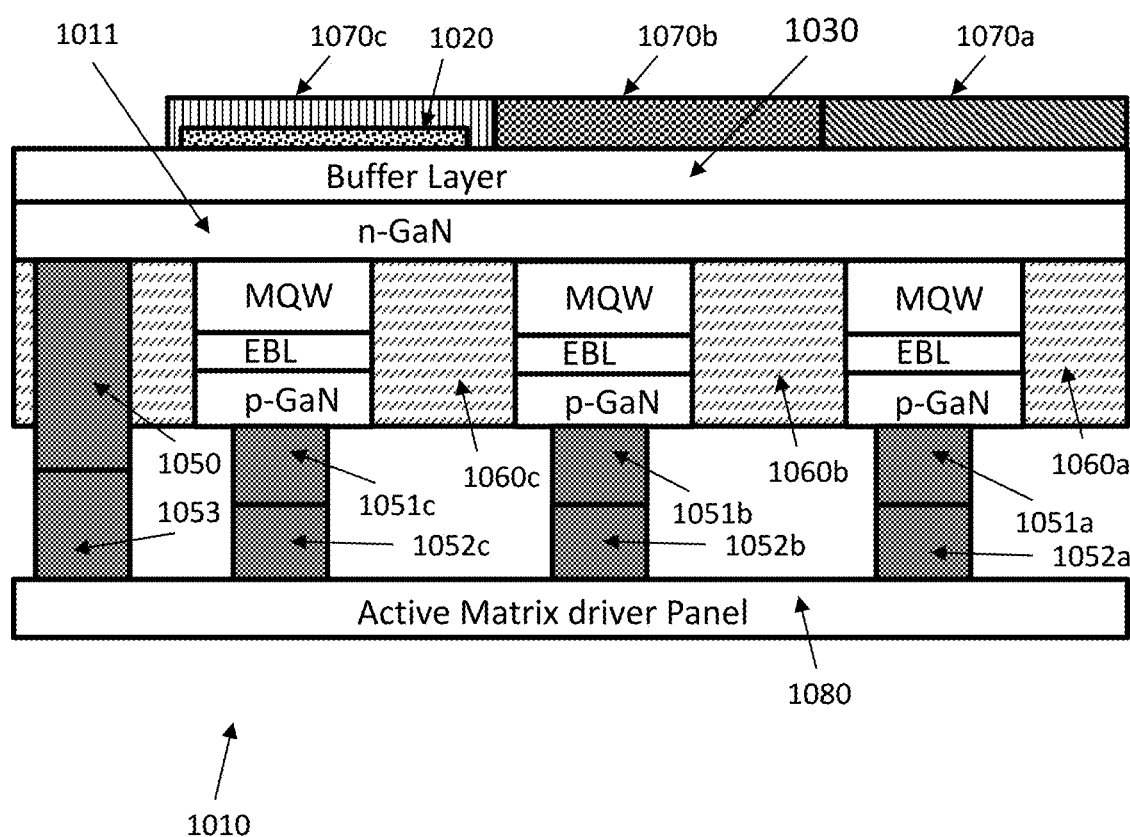
FIG. 10I depicts a cross-sectional view of an exemplary device structure illustrating a ninth fabrication step for fabricating the backside-emitting micro-LED according to certain embodiments.

FIGS. 10G-10I show the process flow for disposing three color filters on top of the semiconductor structure by lithography process for the realization of a backside-emitting full-color micro-LED pixel 1010. The red color filter 1070c is disposed above the buffer layer 1030 at a position corresponding to the third LED 1010c covering the color converting layer 1020 for transmitting red light. Similarly, the green color filter 1070b and the blue color filter 1070a are also disposed above the buffer layer 1030 at a position corresponding to the second LED 1010b and first LED 1010a for transmitting green and blue light respectively. The color filters 1070a, 1070b, 1070c for backside-emitting micro-LED array are similar to the color filters 870a, 870b, 870c for topside-emitting micro-LED array. With the color converting layer 1020 and the three color filters 1070a, 1070b, 1070c disposed at the top of the topside-emitting micro-LED array, the topside-emitting full-color micro-LED pixel 1010 can be realized and each LED can be controlled separately for the generation of the desired color.

Figure 11:
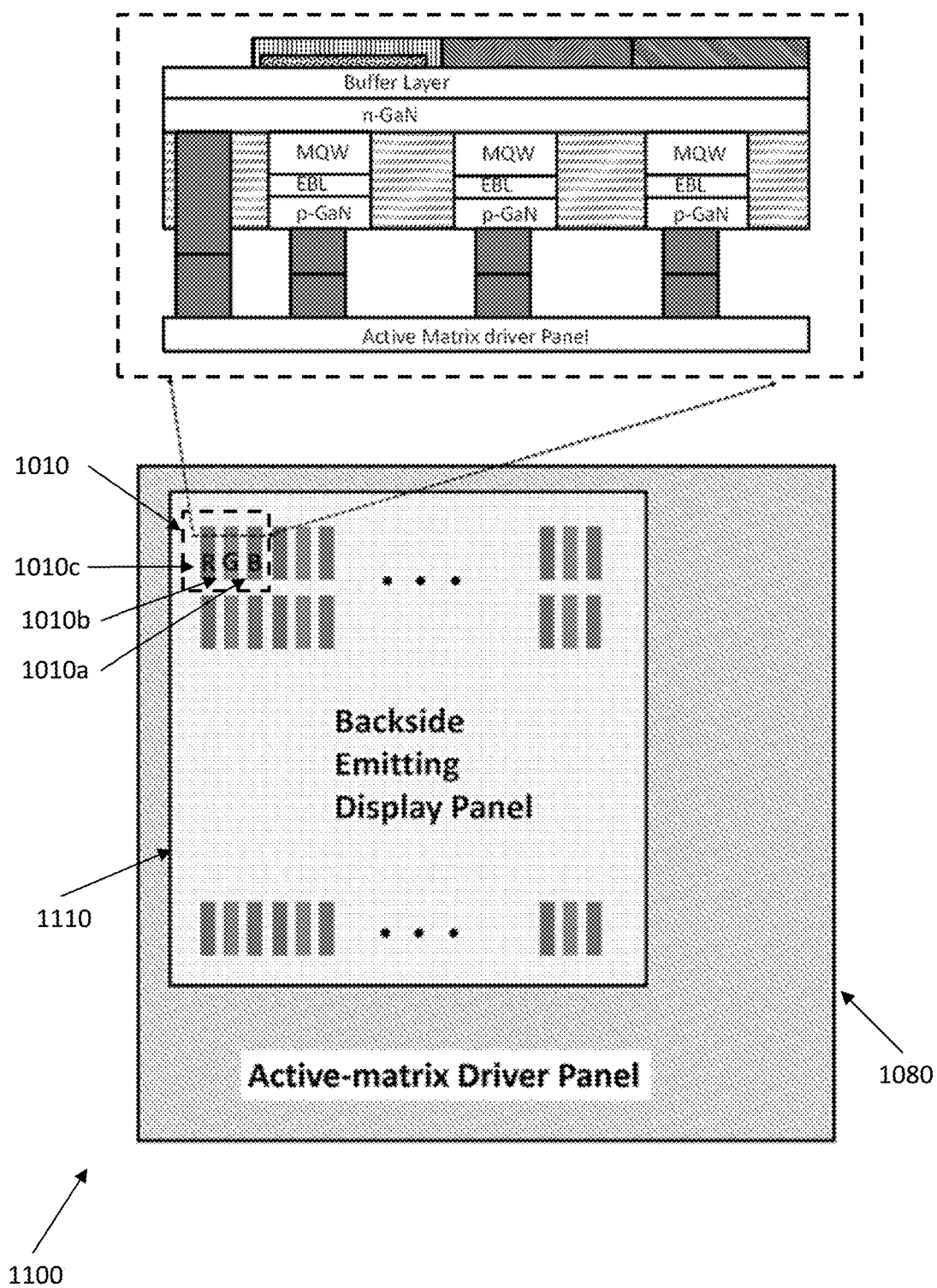
FIG. 11 depicts an active driving scheme of a monolithic full-color display system according to certain embodiments.

FIG. 11 shows an active-matrix driving scheme for the backside-emitting monolithic full-color micro-LED display system 1100 based on the backside-emitting micro-LED pixel 1010 of FIG. 10I. An active-matrix driver panel 1080 uses an array of solder bumps to activate pixels of a display. The monolithic full-color micro-LED display system 1100 comprises an active-matrix driver panel 1080 and an active-matrix micro-LED panel 1110 including a plurality of active-matrix addressable pixels, with the structure of the backside-emitting full-color micro-LED pixel 1010, arranged in an array. Each pixel further comprises a first LED 1010a, a second LED 1010b, and a third LED 1010c.

The active-matrix driver panel 1080 is configured to provide control signals to the active-matrix micro-LED panel 1110 for adjusting the current density applied to each pixel to control the emission peak. In order to control the brightness of each color, time utilizing methods are applied, e.g., PWM and PFM. The active-matrix driver panel 1080 may include other circuit blocks for receiving and processing the input image or input video data for display purposes. Each of the plurality of input color in the image or video may be defined in a color format according to a color standard, e.g., an (R, G, B) color format, a (Y, U, V) color format, an (H, S, V) color format, etc. The active-matrix micro-LED panel 1110 can be formed at least partially by logic gates, analog circuit blocks, transistors, semiconductor devices, discrete components, other electronic devices, or a combination of any aforesaid circuit structures. Other circuit blocks, constant current circuit (e.g., a current mirror), and voltage regulators for driving and updating the active-matrix micro-LED panel 1110 may also be included in the active-matrix driver panel 1080, which are not shown in FIG. 11.

The active-matrix driver panel 1080 is configured to generate a plurality of control signals for driving the first LED 1010a of each pixel with a first current density within the pre-identified first range of the current density for emitting light having the first primary color, the second LED 1010b of each pixel with a second current density within the pre-identified second range of the current density for emitting light having the second primary color, and the third LED 1010c of each pixel with a third current density for emitting light having the first primary color.

For an active-matrix micro-LED panel 1080 with LEDs arranged in m columns and n rows. For example, an active-matrix micro-LED panel 1080 with resolution of 40×40 pixels is arranged in an array of 120 columns and 40 rows (m=120, n=40). The driving current at the p-electrodes 1051a, 1051b, 1051c and the n-electrode 1050 are controlled separately and individually. The current density of each LED can be defined and the brightness can be adjusted using PWM or PFM, thereby the monolithic full-color micro-LED display system 1100 can generate colors for each pixel according to the image or video data provided.

Thus, it can be seen that an improved full-color display and fabrication process for micro-display devices have been disclosed which eliminates or at least diminishes the disadvantages and problems associated with prior art processes and devices. The same MQW structure for the first, second and third LEDs simplifies fabrication of the full-color micro-display devices in accordance with certain embodiments thereby providing a robust, highly scalable fabrication process for full-color micro-display devices with improved yield which advantageously reduces cost. The simplified fabrication process and micro-display devices are enabled by using different current densities to control the three similarly fabricated LED multi-layer MQW structures to produce one of two colors (for example, blue and green) combined with a color converting layer formed over one of the LED MQW structures to produce a third color (for example, red) from one of the two colors so that a micro-display is provided with pixels formed of three LEDs, each having a different one of three colors.

Although the invention has been described in terms of certain embodiments, other embodiments apparent to those of ordinary skill in the art are also within the scope of this invention. Accordingly, the scope of the invention is intended to be defined only by the claims which follow.

What is claimed is:

1. A monolithic full-color light-emitting diode (LED) display panel comprising a plurality of full-color pixels, each full-color pixel comprising:
   a first LED for emitting light having a first primary color;
   a second LED for emitting light having a second primary color;
   a third LED for emitting light having the first primary color; and
   a color converting layer for converting light generated by the third LED into light having a third primary color;
   wherein:
   an intensity of the light having the first primary color emitted from the first LED, an intensity of the light having the second primary color emitted from the second LED and an intensity of the light having a third primary color obtained from the third LED are adjusted and combined in each full-color pixel to provide light having a resultant color;

the first LED, the second LED and the third LED are formed with a same multi-layer semiconductor structure such that an individual LED comprises a multiple quantum well (MQW) active region for generating light of the first primary color and light of the second primary color under a first range of current density and a second range of current density respectively, wherein the MQW active region consists of a first quantum well stack, a second quantum well stack and an intermediate carrier blocking layer sandwiched between the first quantum well stack and the second quantum well stack, the first quantum well stack comprising one or more first quantum wells, the second quantum well stack comprising one or more second quantum wells, each of the first quantum well stack and the second quantum well stack being responsive to charge carriers injected therein for light generation, the first quantum well stack and the second quantum well stack being configured to generate the light of the first primary color and the light of the second primary color respectively, the intermediate carrier blocking layer being configured to modulate a charge-carrier distribution between the first quantum well stack and the second quantum well stack according to a current density of a current applied through the individual LED;

the first quantum well stack, the second quantum well stack and the intermediate carrier blocking layer are co-configured such that the first and second ranges of the current density are identified for configuring the individual LED to emit the light of the first primary color and the light of the second primary color respectively; and each MQW active region consists only of two quantum well stacks and one intermediate carrier blocking layer for forming the plurality of full-color pixels thereby simplifying a fabrication process of the monolithic full-color LED display panel.

2. The monolithic full-color LED display panel of claim 1, wherein the first primary color is blue, the second primary color is green and the third primary color is red.

3. The monolithic full-color LED display panel of claim 1, wherein the first quantum well stack comprises an emission peak between 420 nm and 480 nm and the second quantum well stack comprises an emission peak between 510 nm and 580 nm.

4. The monolithic full-color LED display panel of claim 1, wherein each first quantum well comprises a first quantum well layer, a first quantum barrier layer and a second quantum barrier layer, and each second quantum well comprises a second quantum well layer, a third quantum barrier layer and fourth quantum barrier layer.

5. The monolithic full-color LED display panel of claim 4, wherein the first quantum well layer comprises $In_xGa_{1-x}N$, the second quantum well layer comprises $In_yGa_{1-y}N$, each of the first, second, third and fourth quantum barrier layers comprises GaN.

6. The monolithic full-color LED display panel of claim 5, wherein the x of $In_xGa_{1-x}N$ is equal to a value between 0.1 and 0.2 and the y of the $In_yGa_{1-y}N$ is equal to a value between 0.2 and 0.4.

7. The monolithic full-color LED display panel of claim 4, wherein the first quantum well layer has a thickness between 1 and 10 nm, the second quantum well layer has a thickness between 1 and 10 nm, each of the first, second, third and fourth quantum barrier layers has a thickness between 5 and 30 urn.

8. The monolithic full-color LED display panel of claim 1, wherein the intermediate carrier blocking layer comprises $Al_xGa_{1-x}N$.

9. The monolithic full-color LED display panel of claim 8, wherein the x of the $Al_xGa_{1-x}N$ is equal to a value between 0.05 and 0.3.

10. The monolithic full-color LED display panel of claim 1, wherein the intermediate carrier blocking layer has a thickness between 10 nm and 100 nm.

11. The monolithic full-color LED display panel of claim 1, wherein the first range of the current density is between 0.1 A/cm$^2$ and 1.0 A/cm$^2$ and the second range of the current density is between 30 A/cm$^2$ and 150 A/cm$^2$.

12. The monolithic full-color LED display panel of claim 1, wherein each of the first, second and third LEDs comprises, in overlying sequence, a n-doped semiconductor layer, the MQW active region, an electron blocking layer and a p-doped semiconductor layer.

13. A full-color display system using a passive-matrix driving scheme comprising:

the monolithic full-color LED display panel of claim 12, wherein the full-color pixels are arranged in an array of in columns and n rows; and a driving circuit comprising a data driver having at least m data lines and a scan driver having at least n scan lines;

wherein:

the n-doped semiconductor layers of the full-color pixels on the same column are connected together by the data line and coupled to the data driver;

the p-doped semiconductor layers of the full-color pixels on the same row are connected together by the scan line and coupled to the scan driver; and the data driver and the scan driver are configured to generate a plurality of control signals to drive the first LED of each full-color pixel with a first current density within the first range of the current density, the second LED of each full-color pixel with a second current density within the second range of the current density and the third LED of each full-color pixel with a third current density for emitting light having the first primary color.

14. A full-color display system using an active-matrix driving scheme comprising:

the monolithic full-color LED display panel of claim 12, wherein the full-color pixels are arranged in an array of in columns and n rows; and an active-matrix driver panel configured to flip-chip bond onto the monolithic full-color LED display panel;

wherein:

the n-doped semiconductor layers and the p-doped semiconductor layers of the full-color pixels are connected to the active-matrix driver panel; and the active-matrix driver panel is configured to generate a plurality of control signals to drive the first LED of each full-color pixel with a first current density within the first range of the current density, the second LED of each full-color pixel with a second current density within the second range of the current density and the third LED of each full-color pixel with a third current density for emitting light having the first primary color.

15. The monolithic full-color LED display panel of claim 1, wherein the color converting layer has an emission peak between 610 nm and 700 nm.

16. The monolithic full-color LED display panel of claim 1, wherein the color converting layer comprises cadmium selenide/zinc sulfide (CdSe/ZnS) quantum dots or phosphor powder.

17. A full-color display system comprising:
the monolithic full-color LED display panel of claim 1; and
a data driver and a scan driver are configured to generate a plurality of control signals to drive the first LED of each full-color pixel with a first current density within the first range of the current density, the second LED of each full-color pixel with a second current density within the second range of the current density and the third LED of each full-color pixel with a third current density for emitting light having the first primary color.

18. A method for fabricating a monolithic full-color LED display panel of claim 1 comprising the steps of:
providing a buffer layer formed on a substrate;
forming a stack of semiconductor layers on the buffer layer and etching portions of the stack of semiconductor layers, thereby forming the first LED, the second LED the third LED with the same multi-layer semiconductor structure for each full-color pixel; and
coating the color converting layer on the third LED for each full-color pixel.

19. The method of claim 18, further comprising the steps of:
performing flip-chip bonding onto an active-matrix driving panel; and
removing the substrate to expose the buffer layer as a highest layer such that the color converting layer is coated on the buffer layer.

* * * * *